US006249901B1

(12) United States Patent
Yuan et al.

(10) Patent No.: US 6,249,901 B1
(45) Date of Patent: Jun. 19, 2001

(54) MEMORY CHARACTERIZATION SYSTEM

(75) Inventors: Chen-Ping Yuan, Campbell; Hung-Ta Wei, Milpitas; You-Pang Wei, Los Altos, all of CA (US)

(73) Assignee: Legend Design Technology, Inc., Sunnyvale, CA (US)

( * ) Notice: Subject to any disclaimer, the term of this patent is extended or adjusted under 35 U.S.C. 154(b) by 0 days.

(21) Appl. No.: 09/564,235

(22) Filed: May 4, 2000

Related U.S. Application Data

(63) Continuation-in-part of application No. 08/766,358, filed on Dec. 13, 1996.

(51) Int. Cl.[7] .................................................. G06F 17/16
(52) U.S. Cl. .................................................................. 716/5
(58) Field of Search ........................................... 716/12, 5

(56) References Cited

U.S. PATENT DOCUMENTS 5,933,356 * 8/1999 Rostoker ................................ 716/12

* cited by examiner

Primary Examiner—Matthew Smith
Assistant Examiner—Thuan Do

(74) Attorney, Agent, or Firm—Claude A. S. Hamrick; Justin Boyce; Oppenheimer Wolff & Donnelly LLP

(57) ABSTRACT

An automatic memory characterization system for determining timing characteristics associated with each of a plurality of circuit instances of a memory compiler circuit design includes: an automatic circuit reduction tool for receiving a circuit netlist extracted from layout data defining a circuit instance of the memory compiler, and for generating a critical path netlist; a memory storage unit for storing a timing parameter database including a script file having memory characterization instructions, and at least one specification file associated with one of the timing characteristics to be characterized for the circuit instance, the specification file having a plurality of input signal parameters defining a plurality of input signals to be applied to selected input nodes of the circuit instance, and a plurality of output loading parameters defining a plurality of output loads to be applied to selected output nodes of the circuit instance; a stimulus generator responsive to the input signal parameters and operative to generate a stimulus file; and a circuit simulation manager operative to access the timing parameter database, and to execute at least a portion of the memory characterization instructions, and to generate an updated critical path netlist based on the output loading parameters, the updated critical path netlist and the stimulus file being adapted for use in simulation of the circuit instance.

18 Claims, 26 Drawing Sheets

Setup Time of aa[4] vs clka ##: Slew Rate of aa[4]　　↗ 388

| CLOCK PERIOD \ SLEW RATE | 0.2ns | 0.6ns | 1.4ns | 3.0ns | 4.0ns |
|---|---|---|---|---|---|
| 0.2ns | 1.3676E-10 | 1.3609E-10 | 9.6242E-11 | -1.4511E-11 | -8.4027E-11 |
| 0.6ns | 9.7906E-11 | 9.8424E-11 | 6.5819E-11 | -5.4088E-11 | -1.3318E-10 |
| 1.4ns | 6.9406E-11 | 7.0458E-11 | 3.1140E-11 | -6.6568E-10 | -1.5886E-10 |
| 3.0ns | 6.9086E-11 | 6.7926E-11 | 36656E-11 | -6.7003E-11 | -1.6215E-10 |
| 4.0ns | 8.2875E-11 | 8.0151E-11 | 5.1818E-11 | -5.8668E-11 | -1.3223E-10 |

FIG. 7B

Hold Time of aa[4] vs clka ##: Slew Rate of aa[4]　　↗ 392

| OUTPUT LOADING \ SLEW RATE | 0.2ns | 0.6ns | 1.4ns | 3.0ns | 4.0ns |
|---|---|---|---|---|---|
| 0.2ns | -1.2108E-10 | -2.0021E-10 | -3.3704E-10 | -5.9162E-10 | -7.3681E-10 |
| 0.6ns | -7.9101E-11 | -1.6071E-10 | -2.9636E-10 | -5.3782E-10 | -6.7397E-10 |
| 1.4ns | -5.2699E-11 | -1.3198E-10 | -2.6866E-10 | -5.2339E-10 | -6.6519E-10 |
| 3.0ns | -4.8107E-11 | -1.2844E-10 | -2.6769E-10 | -5.1769E-10 | -6.5659E-10 |
| 4.0ns | -6.0676E-11 | -1.4309E-10 | -2.8476E-10 | -5.1859E-10 | -6.7202E-10 |

FIG. 7C

Hold Time of aa[4] vs clka ##: Slew Rate of aa[4]

| | TRANSITION TIME OF CLOCK SIGNAL | | | | | |
|---|---|---|---|---|---|---|
| OUTPUT LOADING | | 0.2ns | 0.6ns | 1.4ns | 3.0ns | 4.0ns |
| | 0.2ns | -1.2108E-10 | -2.0021E-10 | -3.3704E-10 | -5.9162E-10 | -7.3681E-10 |
| | 0.6ns | -7.9101E-11 | -1.6071E-10 | -2.9636E-10 | -5.3782E-10 | -6.7397E-10 |
| | 1.4ns | -5.2699E-11 | -1.3198E-10 | -2.6866E-10 | -5.2339E-10 | -6.6519E-10 |
| | 3.0ns | -4.8107E-11 | -1.2844E-10 | -2.6769E-10 | -5.1769E-10 | -6.5659E-10 |
| | 4.0ns | -6.0676E-11 | -1.4309E-10 | -2.8476E-10 | -5.1859E-10 | -6.7202E-10 |

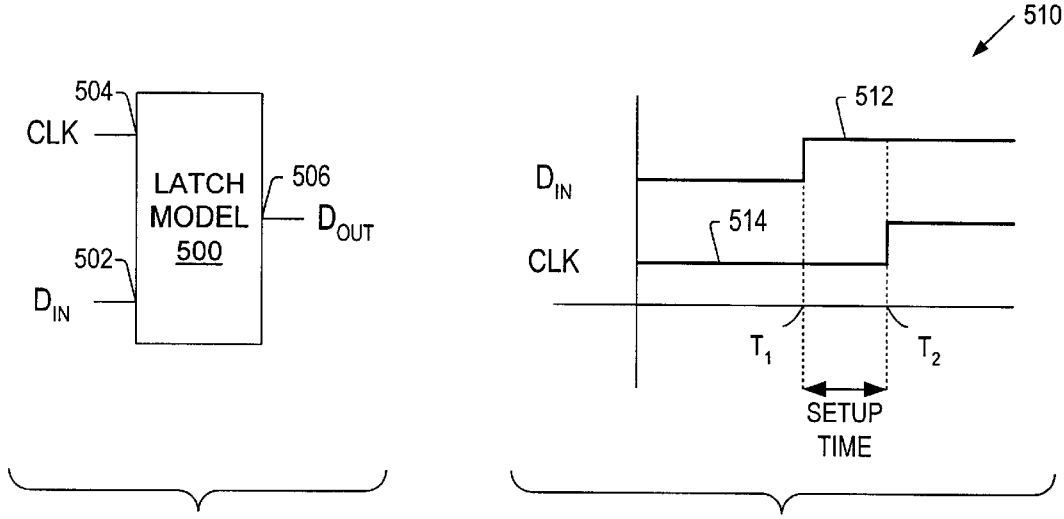
FIG. 8
FIG. 9
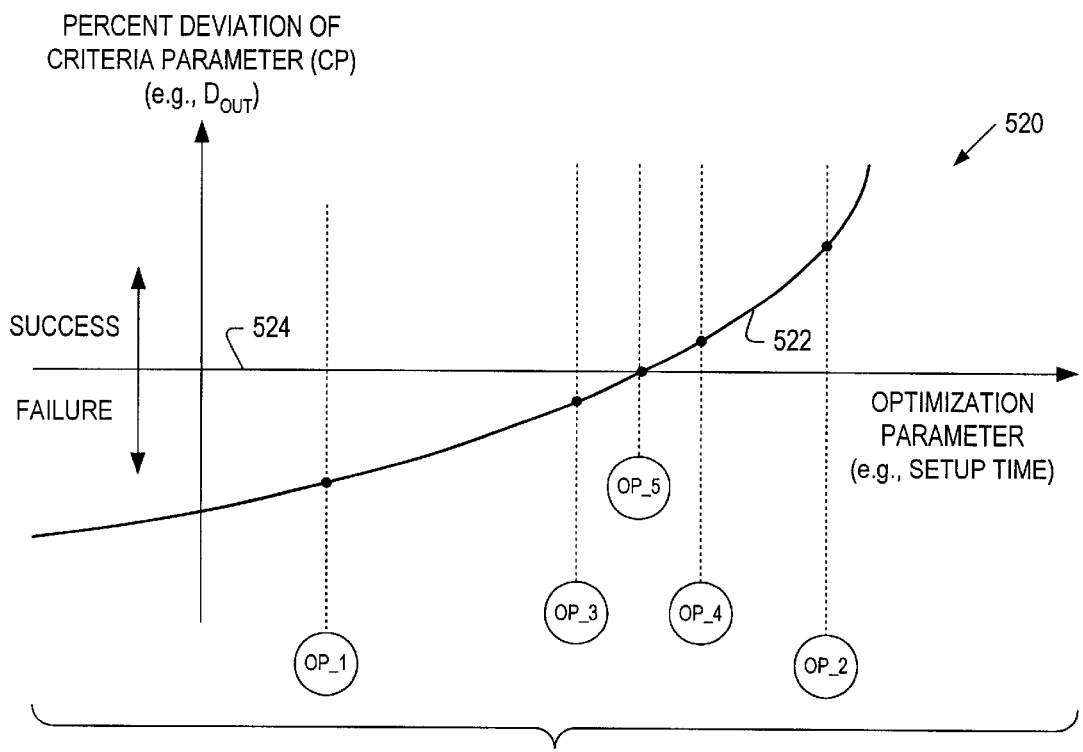
FIG. 10

MEMORY CHARACTERIZATION SYSTEM

CROSS REFERENCE TO RELATED APPLICATIONS

This application is a continuation in part of U.S. application Ser. No. 08/766,358, filed Dec. 13, 1996, entitled "METHOD FOR SIMULATING ULSI/VLSI CIRCUIT DESIGNS". Also, reference is made to and priority claimed from U.S. provisional patent application Ser. No. (not yet assigned), filed Apr. 17, 2000, entitled "MEMORY CHARACTERIZATION".

BACKGROUND OF THE INVENTION

1. Field of the Invention

The present invention relates generally to computer aided methods and tools for designing, simulating, and verifying integrated circuit (IC) designs. More specifically, the present invention relates to an efficient and accurate process of characterizing a plurality of instances of a memory compiler circuit.

2. Description of the Prior Art

The design of very large scale integrated (VLSI) circuits using computer aided design (CAD) systems is a very time-consuming and computationally intensive process. As the complexity of VLSI circuit design has increased, a trend has developed wherein VLSI circuit designers incorporate basic circuit building blocks into circuit designs so that the designers no longer start from scratch in designing a chip. This design approach is commonly referred to as an intellectual property (IP) based design approach, and the basic circuit building blocks are referred to as IP blocks.

In accordance with system on a chip (SOC) technology, a variety of circuit building blocks are incorporated onto a single integrated chip, each of the building blocks performing a specific function of an electronic system. The IP building blocks required for a system chip include embedded memory devices such as SRAM, DRAM, ROM, EPROM, and EEPROM type memory devices. It is common for a single SOC to require between 50 and 100 memory devices. Often, more than 50% of the layout area of a system chip is devoted to embedded memory. Because reusability is a key factor in SOC methodology, system chip designers typically reuse a particular embedded memory design throughout a system chip with minor differences between each instance of the memory design such as variations in the size of the memory array of each instance. The selection of a memory instance is typically determined by an IC designer based on system design requirements and the availability of silicon real estate on the system chip. Different configurations of a memory circuit design are also provided. Such configurations include dual port memory and single port memory.

Design layouts for memory circuit IP building blocks are currently available to IC designers from vendors who provide memory layout databases for a memory compiler, or circuit design, different types of memory circuits. A vendor's memory compiler team may generate thousands of memory instances for each type of memory circuit. Memory compiler tools are used to generate a layout and a netlist for each memory circuit design. Components of memory compiler software used by a memory compiler team typically include a circuit design tool, a layout design tool, and a characterization tool.

IC designers require a timing model including a plurality of characterized timing parameters for each memory instance that the IC designer intends to incorporate into a system chip as embedded memory. Important timing parameters include setup time, hold time, memory access time, minimum pulse high and low time, and other I/O pin characteristics. Memory compilers and IC designers are both interested in characterizing and optimizing timing characteristics associated with a memory design.

Memory compiler teams need to generate a timing model by characterizing each of the timing parameters for each memory instance. A timing model for a memory instance may be determined to a certain degree of accuracy by simulating the memory instance. However, simulation of all of the timing characteristics of a memory instance is a very time consuming and computationally intensive process. Because there may be thousands of memory instances for each memory compiler, it is difficult to generate a white box timing model, that is a timing model based on actual simulation results, for each one of the memory instances. A "black box timing model" for a particular instance of a memory design may be estimated using equations and look up tables determined based on timing models determined for other instances of the memory design having a predetermined relationship with the particular memory instance as further explained below. Typically, a memory compiler vendor will generate a white box timing model for "corner" instances of a memory design such as a first instance having a smallest size memory array that is likely to be used by an IC designer, and a second instance having a largest size memory array that is likely to be used in practice. Black box timing models for memory instances having array sizes ranging between those of the first and second characterized instances are typically determined by interpolation techniques or by equations providing estimated timing characteristics. A vendor's memory compiler typically provides the lookup table and/or equations to IC designers for determining the timing characteristics associated with each memory instance. However, the accuracy of typical prior art black box timing models is not consistent. Furthermore, curve fitting is difficult for multi-dimensional variables.

FIG. 1 shows a generalized circuit block diagram of a memory circuit at 10 that may be used for modeling an instance of embedded memory in a system chip. The memory circuit 10 includes: an address decoder 12 having a plurality of address signal inputs 14 for receiving address signals; an array 16 of memory cells 18 arranged in rows and columns, each cell 18 being communicatively coupled with the address decoder 12 via an associated one of a plurality of word lines 20, which are typically designated by the memory compiler team using convenient names such as WORD_LINE_0, WORD_LINE_1, ... WORD_LINE_ N, for addressing rows of the array; a sense amplifier 24 responsive to column select address information provided by the address decoder 12, and being coupled with each of the cells 18 of the array via an associated one of a plurality of lines 26; a data input buffer 30 having a plurality of ports 32 each being communicatively coupled with one of the bit lines 26, and having at least one input port 34 for receiving a data input signal designated $D_{IN}$ from a source (not shown) that may be provided by another device on the IC chip or provided by an external device via an I/O pin of the chip; and a data output buffer 40 communicatively coupled with the sense amplifier 24 as shown by a line 42 and having at least one output 44 for providing a data output signal designated $D_{OUT}$ to processing circuitry (not shown) on the IC chip or to external processing circuitry via an I/O pin of the system chip.

FIG. 2 shows a flow diagram at 70 illustrating a prior art semi-manual process of characterizing timing parameters for a memory instance of a particular memory circuit design which may be modeled generally by the memory circuit 10 (FIG. 1). The process begins with step 72 in which a memory instance layout data base is generated by a memory compiler team. Note that the process 70 of characterizing timing parameters may be performed by either a memory compiler team, or by an IC designer in which case step 72 may include receiving the memory instance layout database from a vendor. The memory instance comprises a layout database that defines a particular instance memory circuit of a compiler having an array of cells including a plurality of M rows and a plurality of N columns, each cell being defined by a core cell. In step 47, an IC designer performs a partial layout extraction sub-process including manual estimation and segmenting to generate a netlist. Layout extraction generally refers to a process of converting a layout data base into an extracted electric circuit representation including circuit components such as transistors, resistors, capacitors. etc. The extracted electric circuit representation may then be used for simulating the circuit in order to characterize timing parameters. Note that a memory instance layout database may include millions of geometric objects, and therefore a full scale layout extraction process is computationally intensive, and very time consuming. In order to reduce the time and processing power required for the layout extraction process, a manual estimation and segmenting process is traditionally performed by the test engineer to generate a partially extracted and manually estimated netlist.

From step 47, a semi-manual circuit segmenting sub-process 76 is executed on the circuit level using the partially extracted and manually estimated netlist generated in step 74. The circuit segmenting sub-process includes: a step 80 of partitioning the circuit represented by the partially extracted netlist (assumed to be modeled by the memory circuit 10 of FIG. 1) into blocks including at least portion of the address decoder 12 (FIG. 1), the array 16 of memory cells 18, sense amplifier 24, data input buffer 30, and data output buffer 40; and a step 82 of manually generating a critical path circuit netlist for each of the blocks.

The semi-manual circuit segmenting sub-process 76 is described with reference back to FIG. 1. Consider that each of the word lines 20 (FIG. 1) is connected to each of a row of 128 of the memory cells 18. It is generally sufficient to determine timing parameters associated with the four corner memory cells 48 of the array. As an example, in characterizing the access time for the cell 48 that is furthest from the address decoder 12 and connected thereto via WORD_LINE_0, it is necessary to consider a signal path extending from an associated one of the address inputs 14 designated $A_0$ to an associated one of the outputs 44 via the particular memory cell 48. This signal path is segmented into a plurality of signal path segments including: a first segment 50 extending through the address decoder 12 from the address input $A_0$ to WORD_LINE_0; a second segment 52 extending via the WORD_LINE_0 from address decoder 12 to the particular memory cell 48; a third segment 54 extending via an associated one of the bit lines 26 from the particular memory cell 48 to the sense amplifier 24; a fourth segment 56 extending through the sense amplifier 24 from the associated one of the bit lines 26 to the data output buffer 40; and a fifth segment 58 extending through the data output buffer 40 to the associated output 44. A sixth segment 59 is shown extending through the data input buffer 30 from one of the input ports 34 to an associated one of the bit lines 26. A test engineer performing the semi-manual circuit segmenting sub-process 76 analyzes the partially extracted netlist generated in step 74 to determine each of the segments 50, 52, 54, 56, and 58 (FIG. 1). This is a very time consuming and error-prone process.

Typically, characteristics of the selected critical paths are only estimated because the electrical coupling effects of other circuit paths on the selected paths are either completely ignored or approximated in order to minimize the time and processing power required to ultimately generate the timing characteristics associated with the selected path. For example, input signals applied to the address inputs $A_1$, $A_2$, $A_3$, . . . , $A_N$ effect the circuit performance of the first segment 50 connected to the first address input $A_0$ of the address decoder 12 (FIG. 1) through electrical coupling effects. However, the coupling effects of signals applied to address pins A, $A_2$, $A_3$, . . . , $A_N$ are typically ignored in modeling the circuit performance of the first segment 50 because it is too time consuming to consider the RC coupling effects of each of these such circuits. This results in decreased accuracy in the timing model for the selected critical path.

From step 82, the process proceeds to step 84 in which the test engineer adjusts the critical path circuit netlist generated in steps 80 and 82 as described above by parameterized loading of selected ones of the segments of the critical paths. As an example, characteristics of the second signal path segment 52 (FIG. 1) traversing WORD_LINE_0 between the address decoder and the memory cell 48 are typically estimated in accordance with a method wherein the remaining memory cells connected to WORD_LINE_0 are modeled by parameterized loading values. Each of the memory cells connected to WORD_LINE_0 causes a side loading of the second signal path segment 52. Parameterized loading values for the signal path segment 52 are typically estimated for each of a plurality of selected groups 60 of the memory cells connected to WORD_LINE_0. Likewise, parameterized loading values for the third path segment 54 are typically estimated for each of a plurality of selected groups 62 of the memory cells connected to the associated one of the bit lines 26.

Having been adjusted by parameterized loadings in step 84, the manually generated critical path circuit netlist is simulated in step 86 using a standard commercially available circuit simulation program such as HSPICE™. In step 88, timing results are generated for each of the critical paths. Results must be generated for a plurality of parameters including access time, setup time, hold time, and pulse width. The circuit netlist created as a result of the semi-manually performed steps 74, 80, 82, and 84 described above is a reduced circuit netlist and therefore the time and processing power required to execute the simulation step 86 is reduced. However, the performance of steps 74 through 84 is very time consuming.

In accordance with the conventional circuit segmenting sub-process 76, the RC coupling between two segments is ignored. For example, the total delay through a plurality of interconnected segments is determined by determining a sum of the timing delays through each of the paths, such as adding the decoder path delay to the memory array delay to the sense amp delay. This results in incomplete or inaccurate results because the coupling effects are not accurately accounted for.

Simulation of the reduced circuit netlist yields a timing model for the selected critical paths that is not very accurate and prone to errors due to the above described manual estimations performed in steps 74, 80, 82, and 84. Another disadvantage of the conventional semi-manual process 70 of characterizing timing parameters for a memory instance is that it is very time consuming to perform each of the steps of the process. It is impractical or unfeasible to characterize the timing models for all of the memory instances because there may be thousands of memory instances and it is far too time consuming to characterize each one. Therefore, white box timing models are typically only determined for a group of 10 or 20 corner instances of an embedded memory circuit design, and black box timing models for additional memory instances are usually determined by interpolation techniques or by equations based on the characterizations of the corner instances.

FIG. 3 shows an interpolation diagram at 90 generally illustrating a memory instance timing parameter interpolation diagram. A white box model for a first set of timing characteristics is determined for a first memory instance 92, and a white box model for a second set of timing characteristics is determined for a second memory instance 94. A black box timing model may be subsequently determined by interpolation for a third memory instance 96 that is assumed to have timing characteristics within a range defined by the first and second memory instances 92 and 94. The diagram 90 generally illustrates a black box timing model which may be actually implemented using either look up tables or equations.

Problems with the parameterized approach of the prior art characterization methods include the difficulty of scaling, and non-linear correlation in the resulting timing model. The actual variations in RC effects from one array size and aspect ratio to another are not linear as assumed in prior art characterization methods. Also, the parameterized loading, described above, cannot be assumed to increase linearly as array size increases, and without regard for differences in aspect ratio.

Another problem associated with the segmenting approach of conventional characterization methods is that timing parameters such as setup, hold time, and minimum pulse width are only estimated. In order to increase performance of a memory circuit, these timing parameters should be optimized. In accordance with conventional characterization methods, these timing parameters are typically estimated very conservatively in order to achieve accurate performance criteria without optimal performance.

As described above, in accordance with the prior art memory characterization tools, many functions must be performed manually or at least semi-manually. In accordance with prior art memory characterization methods, the manual segmenting of circuits piece by piece is very time consuming and cumbersome and must be repeated many times for each embedded memory instance having a different size such as a different word count or a different bit count. Also, there is a danger of making an overly simplified assumption that secondary effects such as RC coupling are ignored in the prior art memory characterization methods.

What is needed is an automatic memory characterization system that provides improved accuracy in determining timing characteristics of a circuit.

What is also needed is an automatic memory characterization system that provides the ability to characterize timing parameters of a large number of memory instances of a memory compiler in a relatively short period of time with minimal effort by a user of the system.

SUMMARY OF THE INVENTION

It is an object of the present invention to provide an automatic memory characterization system that provides improved accuracy in determining timing characteristics of a circuit.

It is also an object of the present invention to provide an automatic memory characterization system that provides the ability to characterize timing parameters of a large number of memory instances of a memory compiler in a relatively short period of time with minimal effort by a user of the system.

It is also an object of the present invention to provide a documentation mechanism for preserving the assumptions and methods of characterizing memory timing parameters in a computer aided design system.

Briefly, a presently preferred embodiment of the present invention includes an automatic memory characterization system for determining timing characteristics associated with each of a plurality of circuit instances of a memory compiler circuit design. The system includes: an automatic circuit reduction tool for receiving a circuit netlist extracted from layout data defining a circuit instance of the memory compiler, and for generating a critical path netlist; and a memory storage unit for storing a timing parameter database including a script file having memory characterization instructions, and at least one specification file associated with one of the timing characteristics to be characterized for the circuit instance, the specification file having a plurality of input signal parameters defining a plurality of input signals to be applied to selected input nodes of the circuit instance, and a plurality of output loading parameters defining a plurality of output loads to be applied to selected output nodes of the circuit instance.

The automatic memory characterization system also includes a stimulus generator responsive to the input signal parameters and operative to generate a stimulus file; and a circuit simulation manager operative to access the timing parameter database, and to execute at least a portion of the memory characterization instructions, and to generate an updated critical path netlist based on the output loading parameters, the updated critical path netlist and the stimulus file being adapted for use in simulation of the circuit instance.

An automatic memory characterization process performed by the system includes the steps of: receiving a memory circuit netlist extracted from layout data defining a memory circuit; performing an automatic circuit reduction process on the circuit netlist to generate a critical path netlist; generating a specification file based on a data sheet associated with timing parameters to be characterized for the instance, the specification file including at least one input signal parameter defining an associated input signal to be provided to a selected input node of the circuit, and at least one output loading parameter defining an associated output load to be applied to a selected output node of the circuit; generating an updated critical path netlist based on the critical path netlist and the output loading parameter; and performing at least one circuit simulation process based on the updated critical path netlist and the updated stimulus file to yield an associated value for the timing parameter.

Important advantages of the automatic memory characterization process of the present invention include improved accuracy in determining timing characteristics of a memory instance, and the ability to characterize timing parameters of a large number of memory instances of a memory compiler in a relatively short period of time with minimal effort by a user of the system.

The foregoing and other objects, features, and advantages of the present invention will be apparent from the following detailed description of the preferred embodiment which makes reference to the several figures of the drawing.

IN THE DRAWING

FIG. 1 a generalized circuit block diagram of a memory circuit design that may be used for modeling an embedded memory circuit in a system chip;

FIG. 7B is a table diagram illustrating setup time characterization results generated by the automatic memory characterization system of FIG. 5 as a function of varying clock period values of an input clock signal, and varying slew rate values of an address input signal;

FIG. 7C is a table diagram illustrating hold time characterization results generated by the automatic memory characterization system of FIG. 5 as a function of varying output loading parameters, and varying slew rate values of an address input signal;

FIG. 7D is a table diagram illustrating access time characterization results generated by the automatic memory characterization system of FIG. 5 as a function of varying output loading parameters, and varying transition times of an input clock signal;

FIG. 8 is a block diagram generally illustrating a latch circuit that provides a generalized model for a selected critical circuit path segment through a portion of a memory circuit;

FIG. 9 is a timing diagram illustrating relationships between an input data signal and an input clock signal defining a setup time parameter associated with a selected signal path through the memory circuit as modeled by the latch circuit of FIG. 8;

FIG. 10 is a bisection model diagram used in accordance with an automated binary search method of the present invention for optimizing a timing parameter;

Figure 12A:
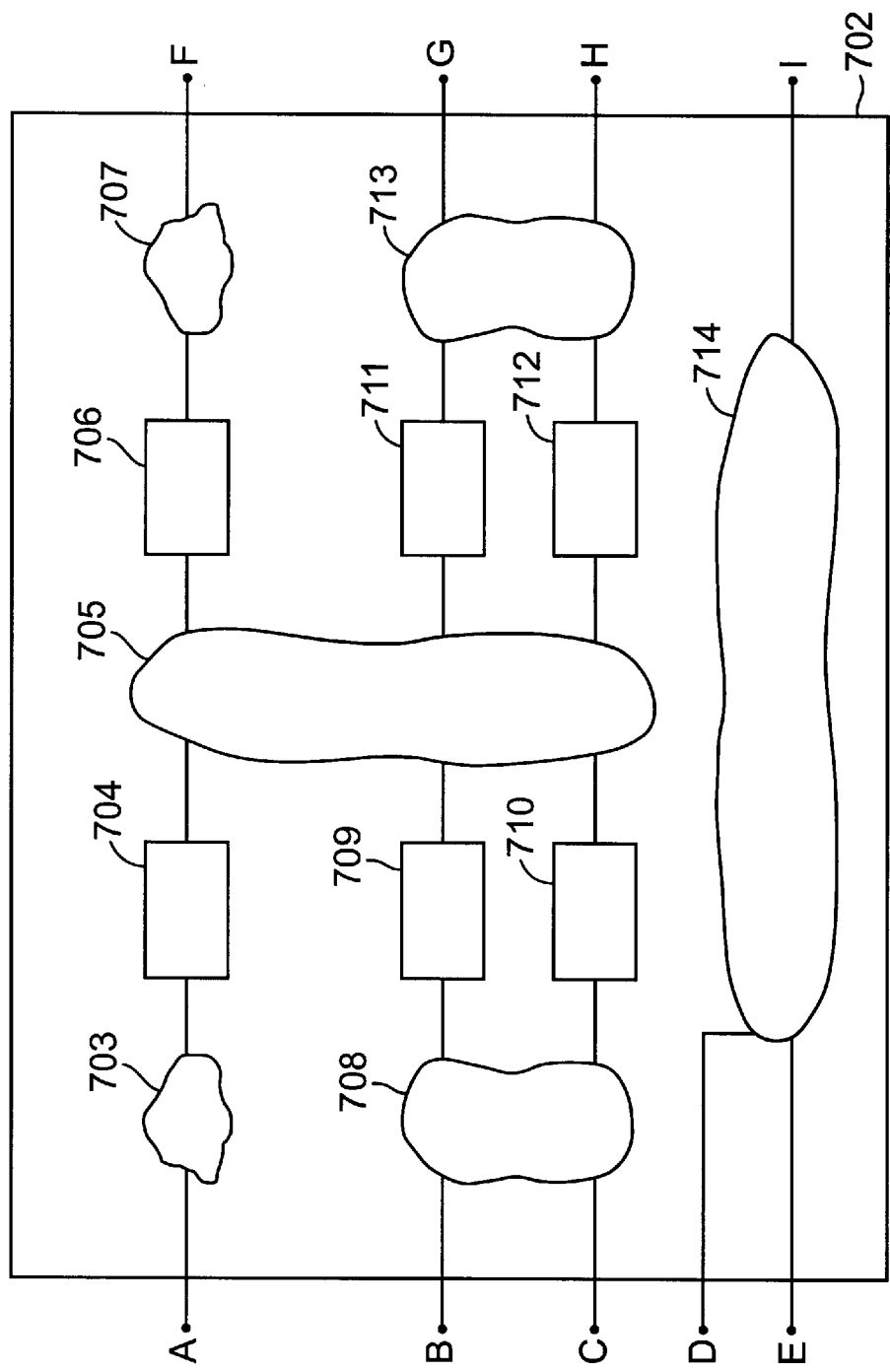
Figure 12B:
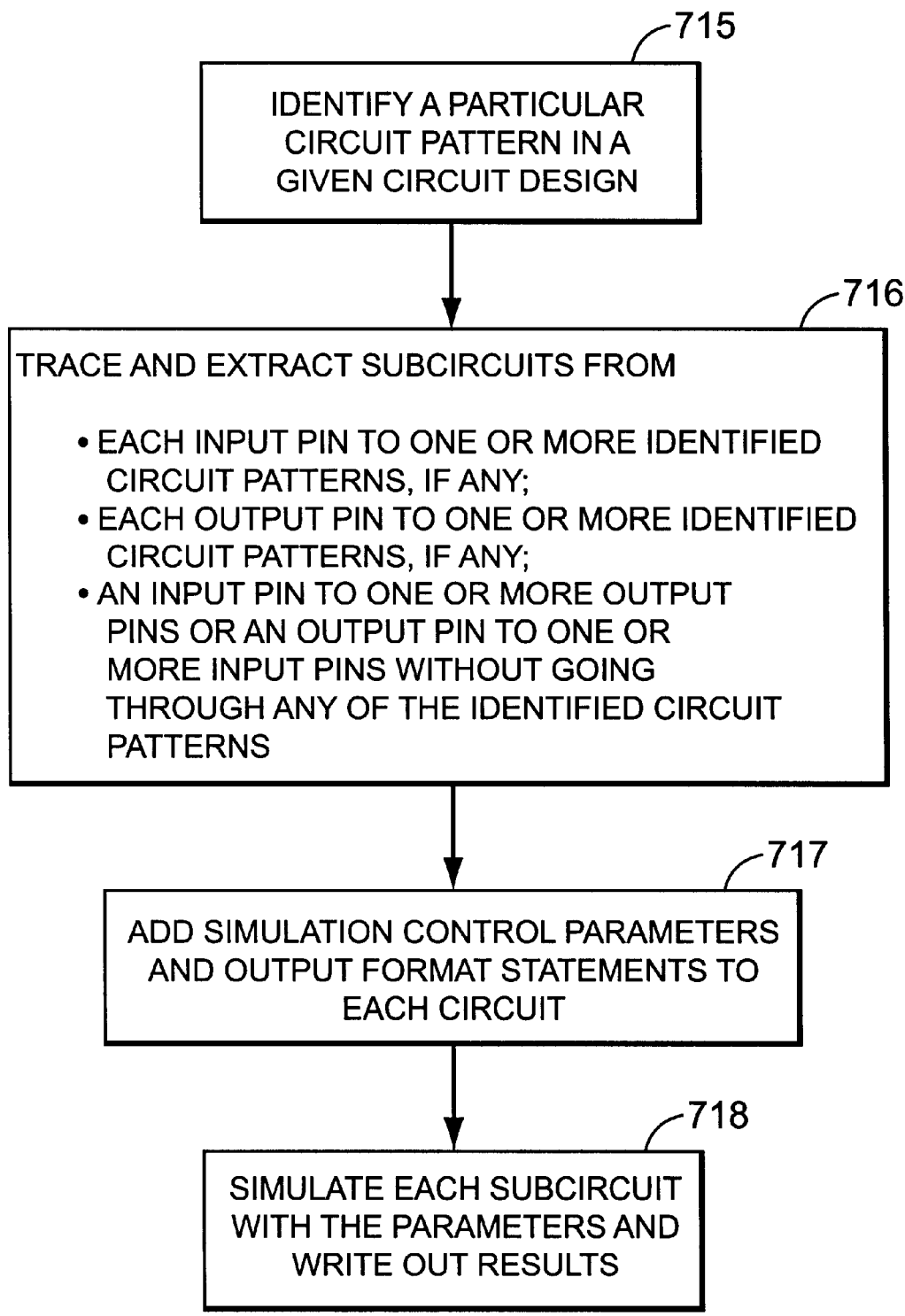
Figure 13:
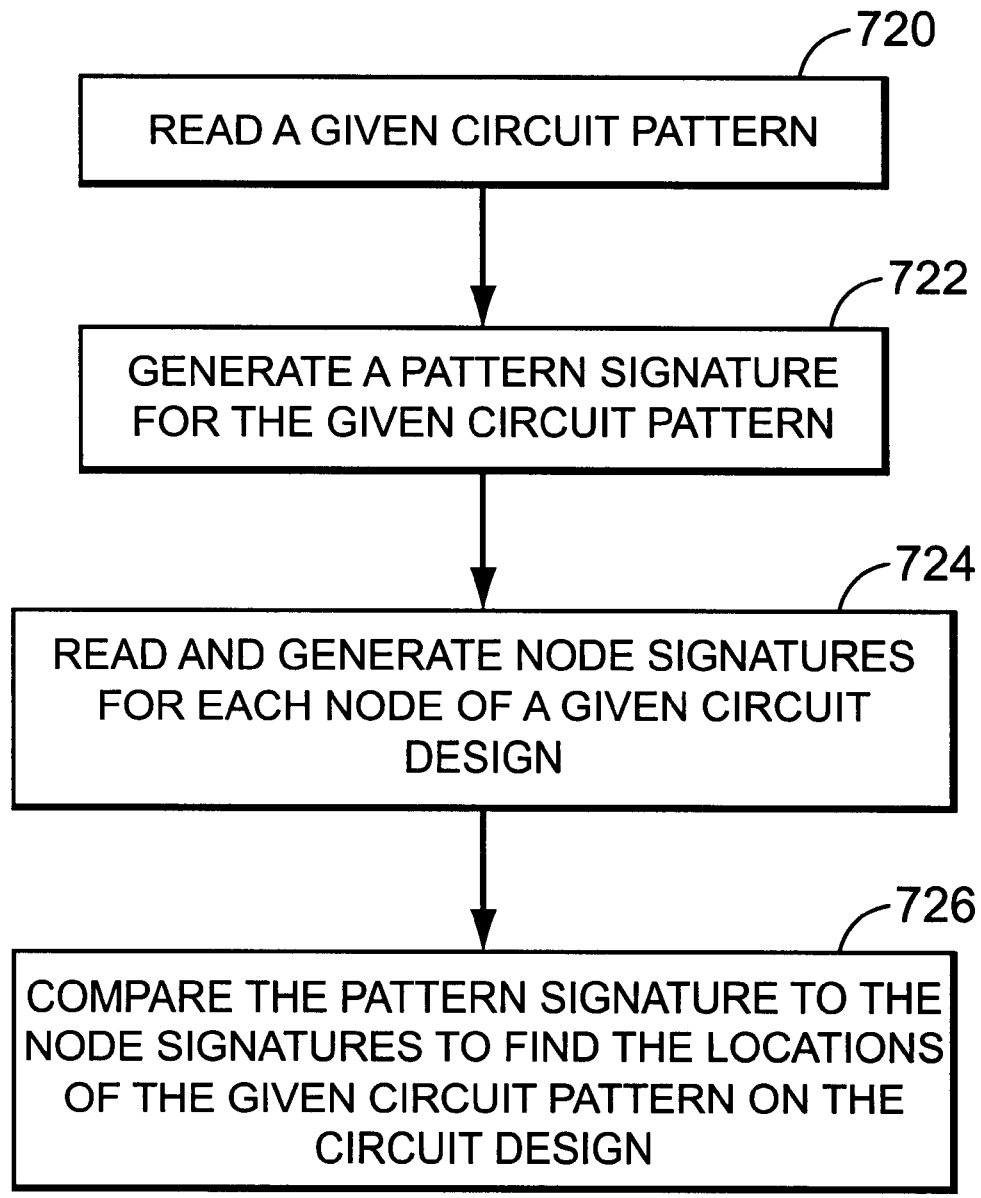
Figure 14:
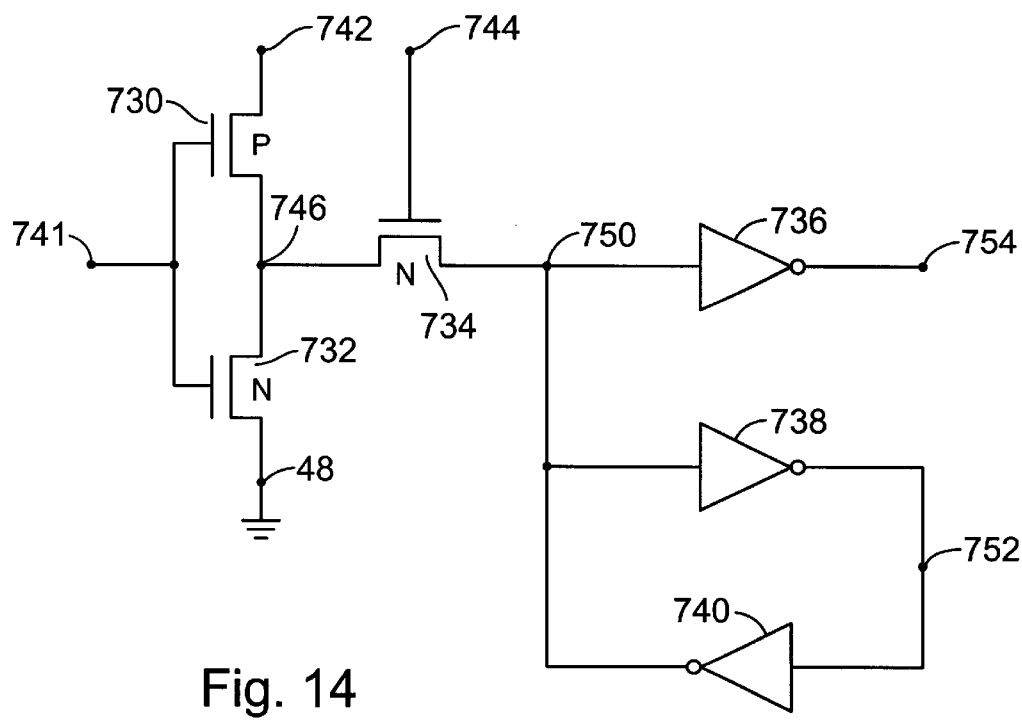
Figure 15:
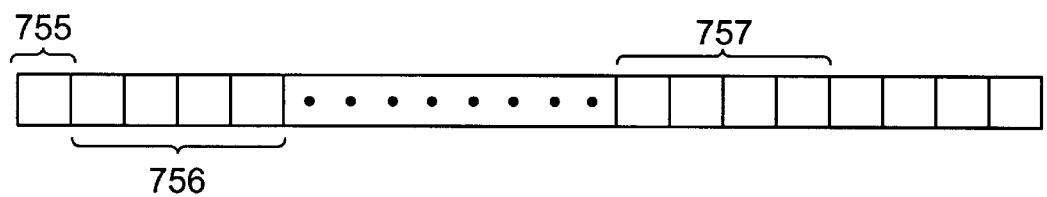
Figure 16A:
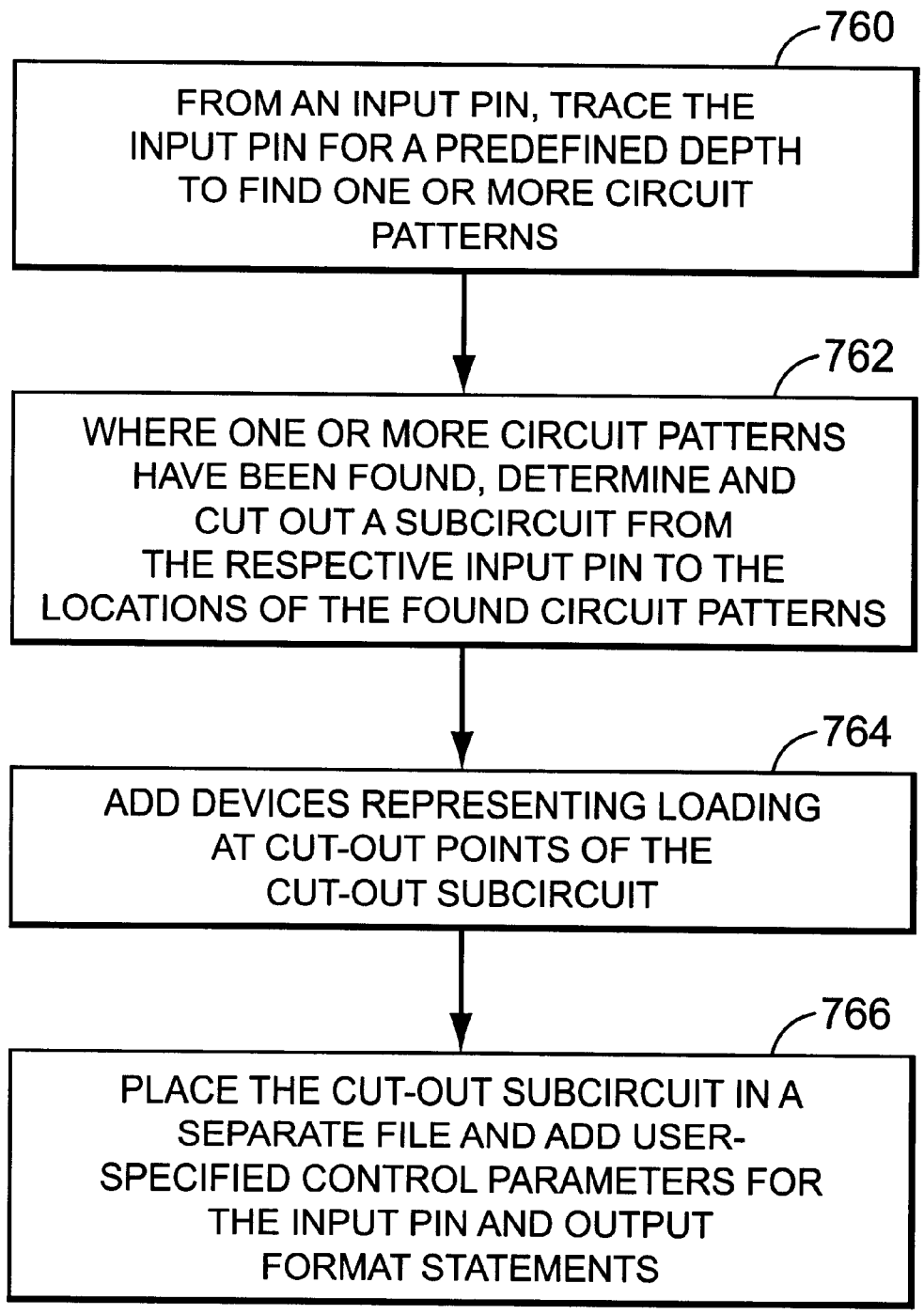
Figure 16B:
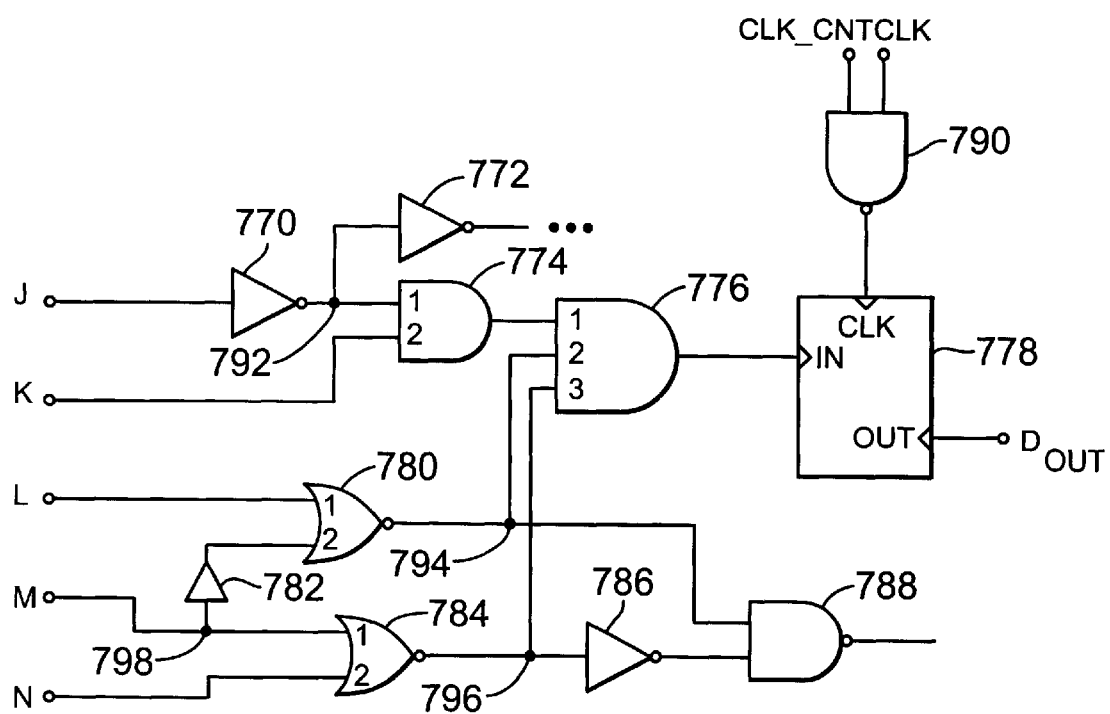
Figure 17A:
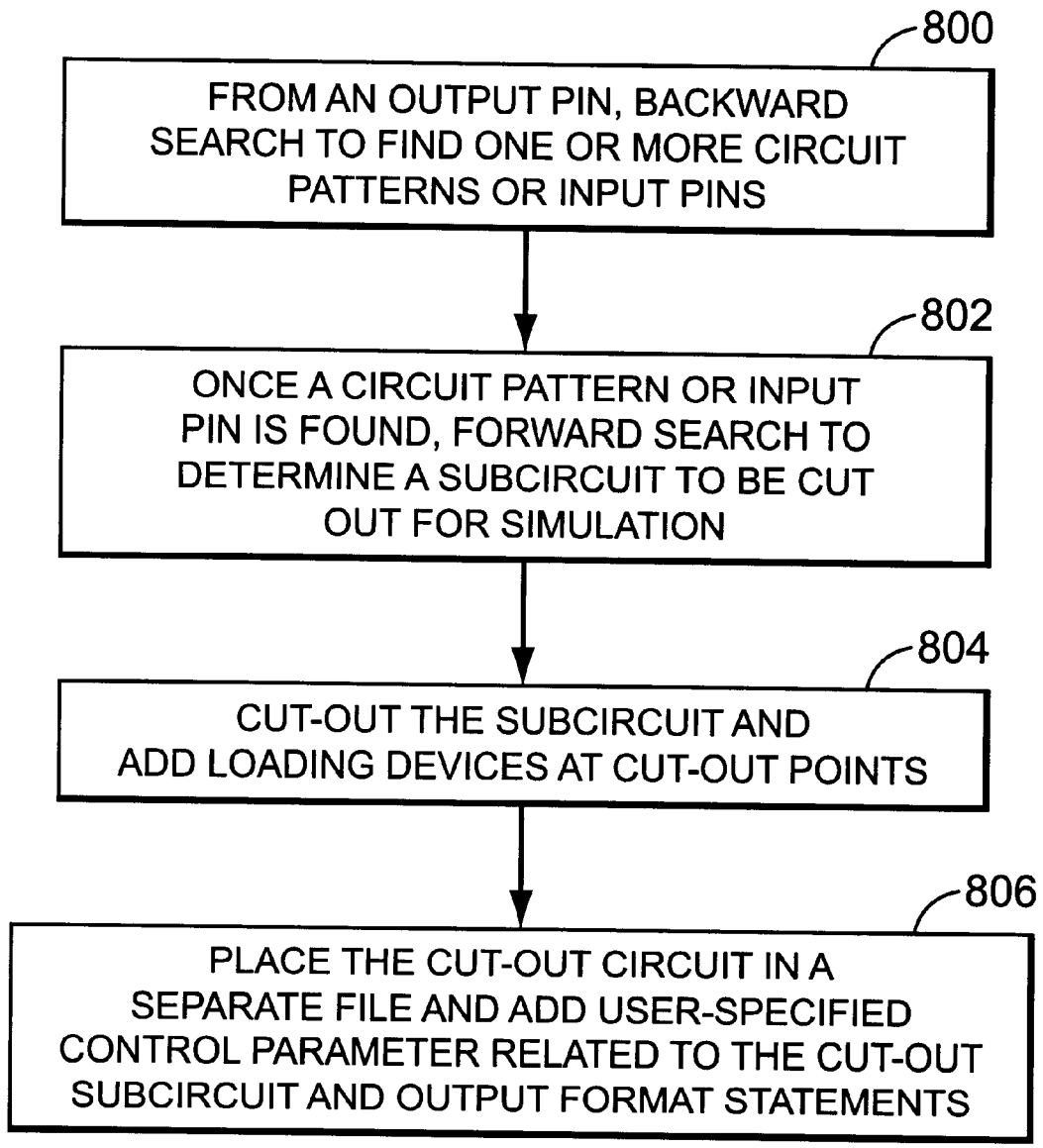
Figure 17B:
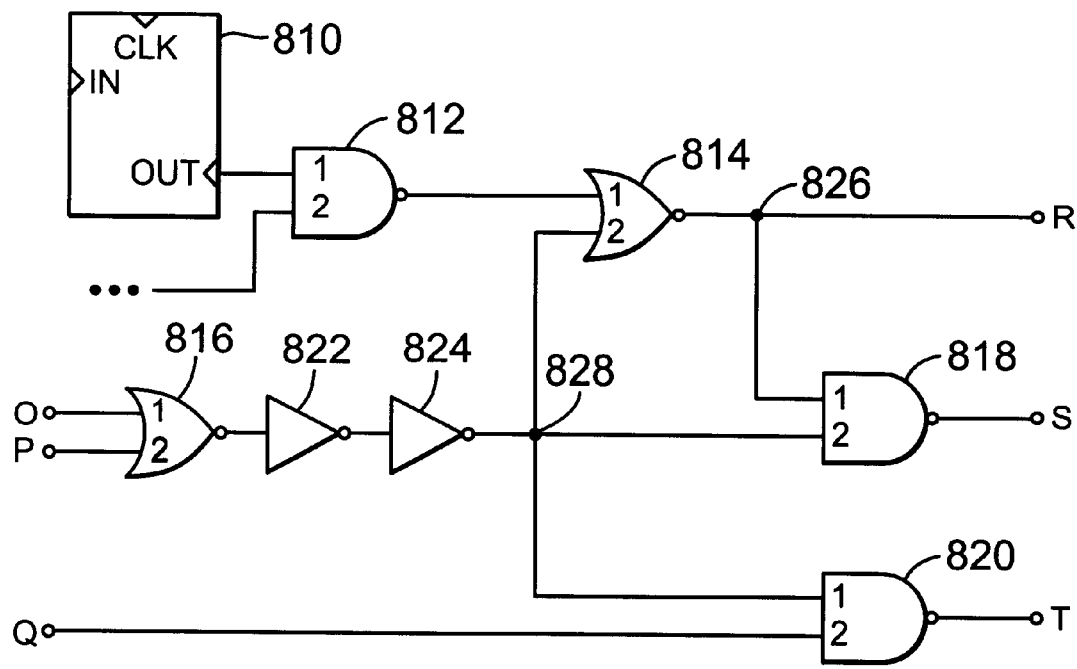
Figure 18A:
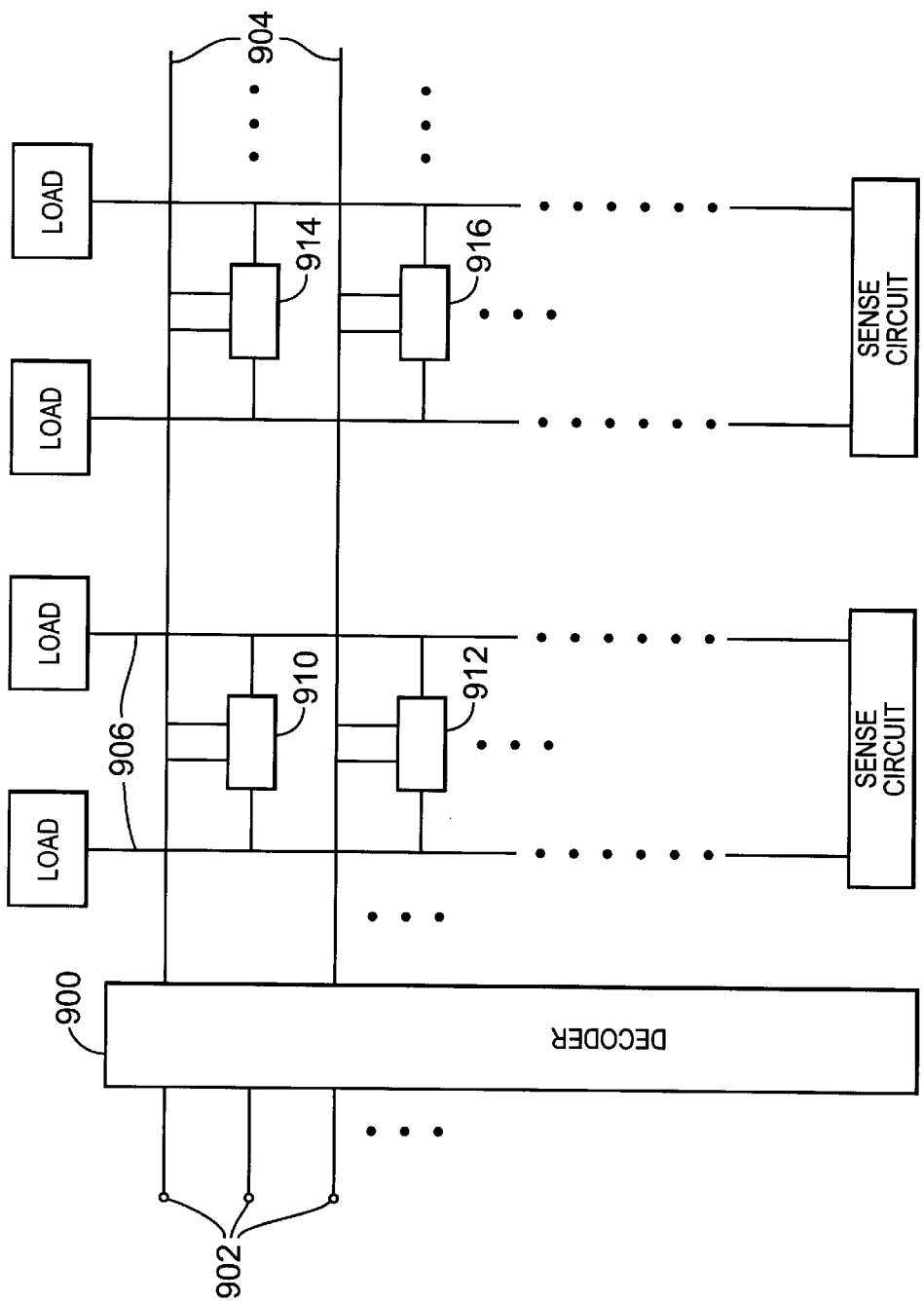
Figure 18B:
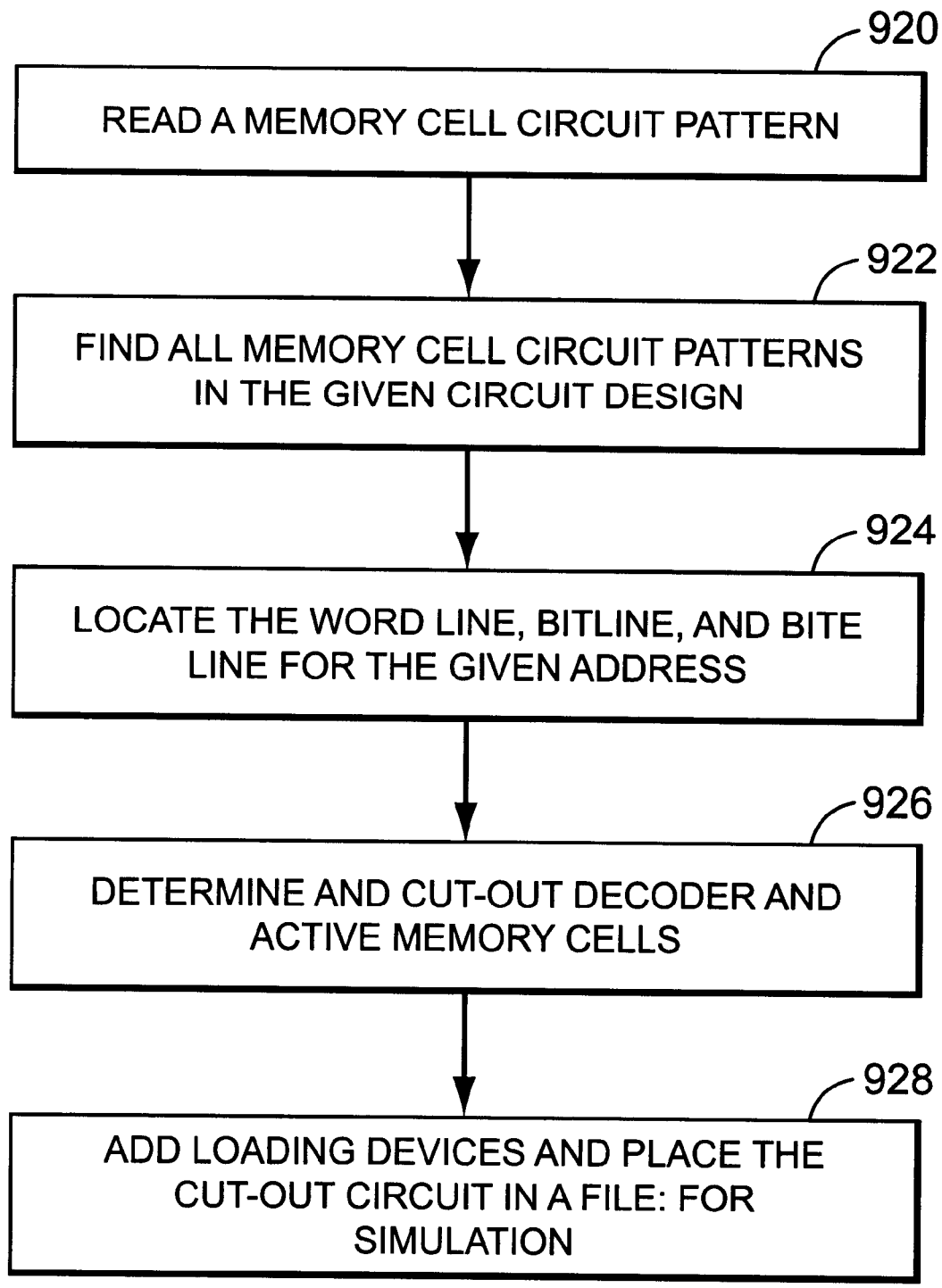
Figure 19:
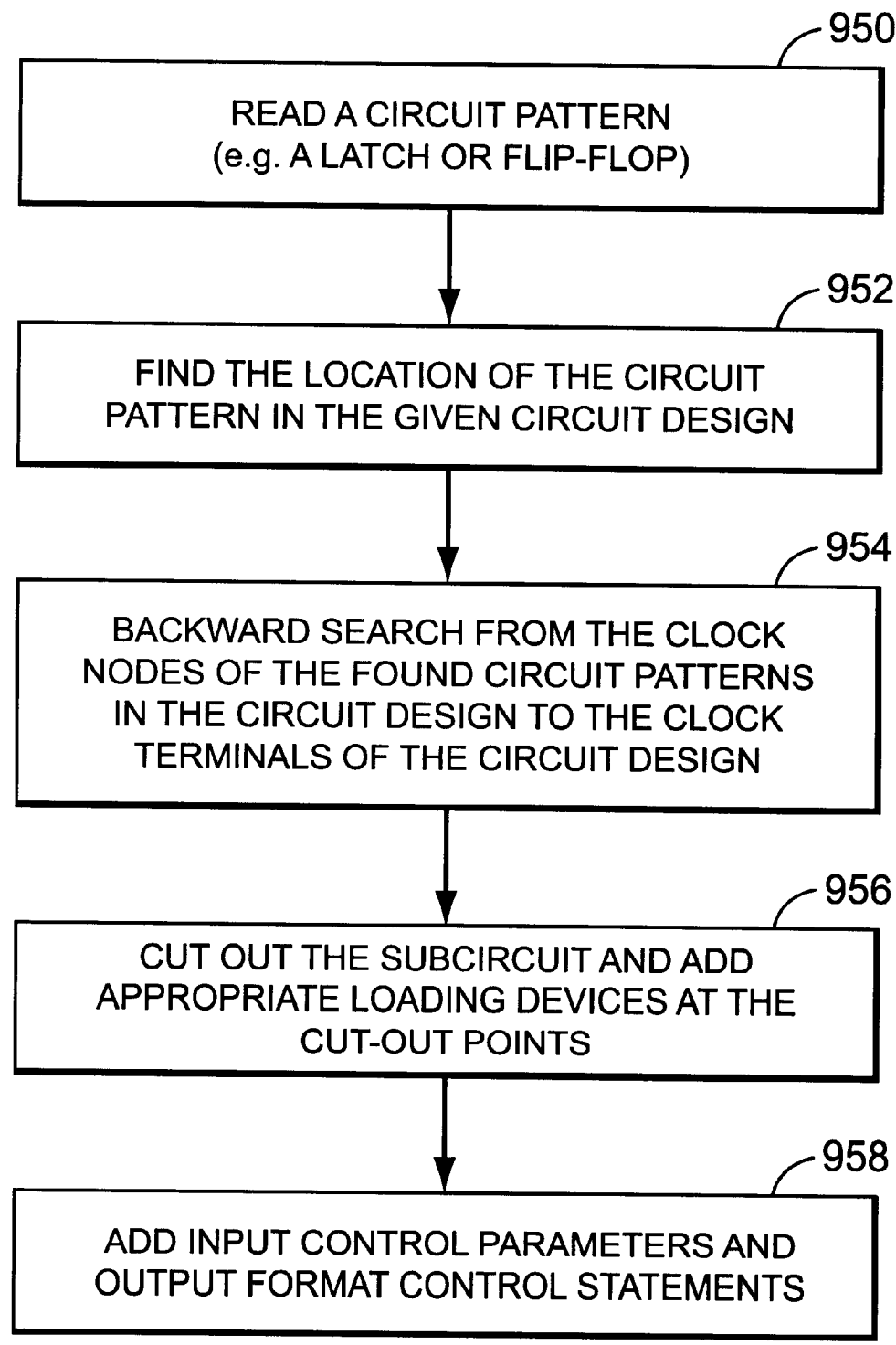

FIG. 12a conceptually illustrates a general layout of a circuit design that may be reduced by operation of an automatic circuit reduction tool of the memory characterization system;

FIG. 12b illustrates a flow chart of the general steps of an automatic circuit reduction process of the present invention;

FIG. 13 illustrates a flow chart of the general steps in searching for a circuit pattern in a given circuit design;

FIG. 14 illustrates the schematic diagram for a particular circuit pattern;

FIG. 15 shows a bit pattern representing a signature;

FIG. 16a shows a flow chart of the general steps in searching from an input pin to the circuit pattern(s) within the given circuit design, determining the subcircuit to be extracted, and extracting the subcircuit;

FIG. 16b illustrates a schematic diagram to demonstrate the forward search path in finding one or more latches and the backward search path in finding the pertinent input pins;

FIG. 17a shows a flow chart of the general steps in searching from an output pin to a particular circuit pattern, determining the subcircuit to be extracted for the corresponding output pin, and extracting the subcircuit;

FIG. 17b illustrates a schematic diagram to demonstrate the backward search path in finding one or more latches and the forward search path in finding the pertinent output pins;

FIG. 18a illustrates a general memory circuit design;

FIG. 18b shows a flow chart of the general steps in applying an embodiment of the present invention to memory circuit designs; and FIG. 19 shows a flow chart of the general steps in applying an embodiment of the present invention to clock tree applications.

DETAILED DESCRIPTION OF THE PREFERRED EMBODIMENTS

Figure 4:
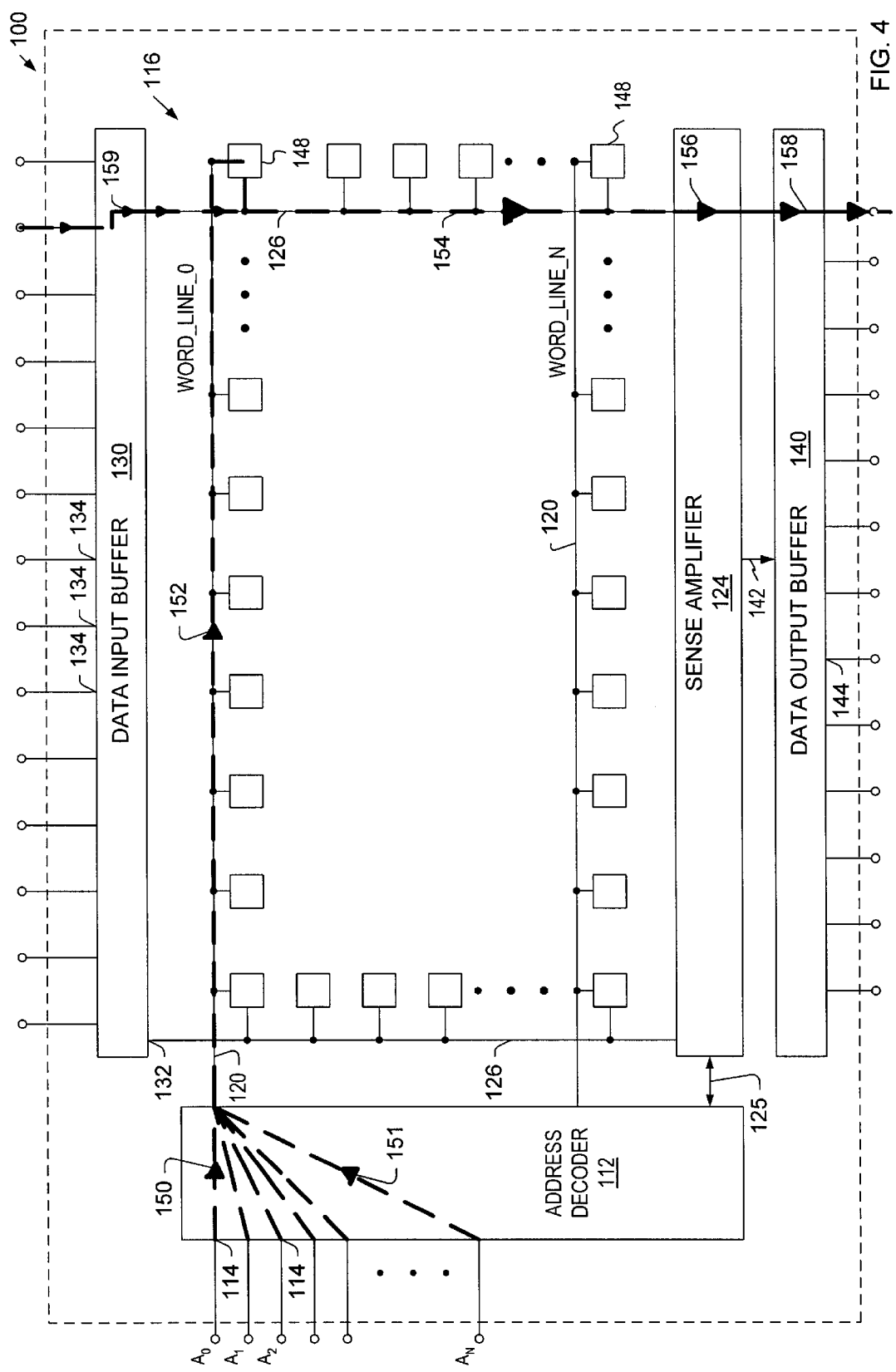
FIG. 4 is a generalized circuit block diagram of a memory circuit design model and signal path segments therethrough as automatically selected and modeled in accordance with the present invention.

FIG. 4 shows a generalized circuit block diagram of a memory circuit at 100 that may be used for implementing embedded memory in a system chip. The memory circuit 100 includes: an address decoder 112 having a plurality of address signal input ports for receiving address signals; an array 116 of memory cells 118 arranged in rows and columns, each cell 118 being communicatively coupled with the address decoder 112 via an associated one of a plurality of word lines 120, which are typically designated by the memory compiler using convenient names such as WORD_LINE_0, WORD_LINE_1, . . . WORD_LINE_N, for addressing rows of the array; a sense amplifier 124 responsive to column select address information provided by the address decoder 112, and being coupled with each of the cells 118 of the array via an associated one of a plurality of bit lines 126; a data input buffer 130 having a plurality of ports 132 each being communicatively coupled with one of the bit lines 126, and having at least one input port 134 for receiving a data input signal designated $D_{IN}$ from a source (not shown) that may be provided by another device on the IC chip or provided by an external device via an I/O pin of the chip; and a data output buffer 140 communicatively coupled with the sense amplifier 124 as shown by a line 142 and having at least one output port 44 for providing a data output signal designated $D_{OUT}$ to processing circuitry on the IC chip or to external processing circuitry via an I/O pin of the chip.

Figure 5:
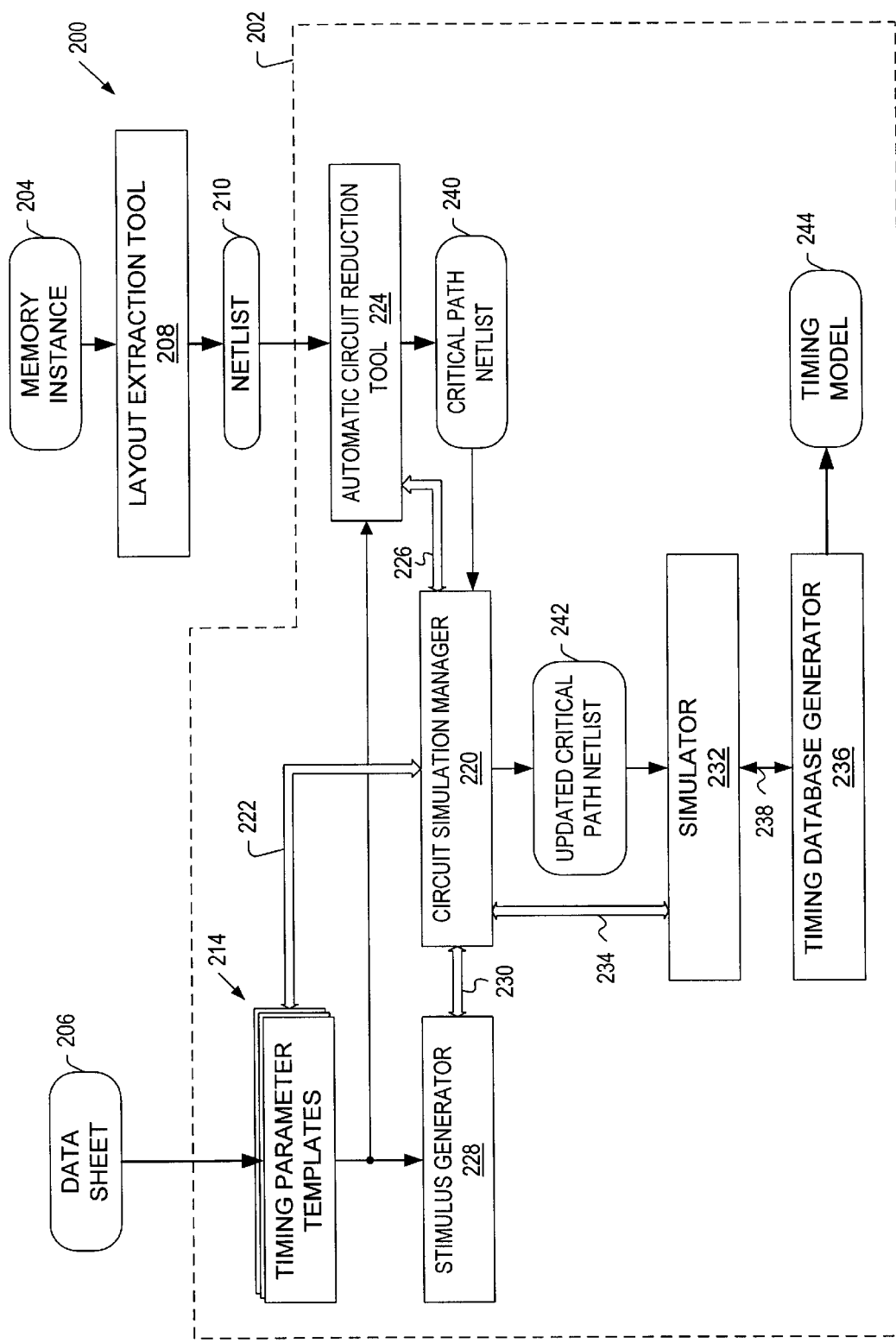
FIG. 5 is a block diagram generally illustrating a memory characterization system in accordance with the present invention for automatically characterizing timing parameters of a plurality of instances of a memory compiler.

FIG. 5 shows a block diagram generally illustrating a memory characterization system in accordance with the present invention at 200. The system 200 includes a memory characterization tool 202. A memory instance 204 of a memory compiler is provided in the form of a layout database. A data sheet 206 is provided for the memory instance 204. A layout extraction tool 208 is operative to generate a netlist 210 based on the memory instance 204.

The memory characterization tool 202 includes: a memory storage unit for storing a timing parameter template database 214 including a plurality of timing parameter templates including at least one specification file and at least one script file for determining characteristics of each of a plurality of timing parameters as further explained below; a circuit simulation manager 220 operative to access the timing parameter templates stored in the database 214 as indicated by a line 222; an automatic circuit reduction tool 224 that is communicatively coupled with the circuit simulation manager 220 as indicated by a line 226; a stimulus generator 228 that operates under control of the circuit simulation manager 220 as indicated by a line 230; a simulator 232 that operates under control of the circuit simulation manager 220 as indicated by a line 234; a timing database generator 236 that receives simulator data from the simulation 232 as indicated by a line 238; and a timing model database 244 generated by the timing database generator 236.

In one embodiment, each of the circuit simulation manager 220, automatic circuit reduction tool 224, stimulus generator 228, and simulator 232 is a computer implemented system implemented by executing computer readable instructions by a processing unit. In one embodiment, the circuit simulation manager is operative to execute memory characterization instructions read from script files of the timing parameter template database for controlling the automatic circuit reduction tool 224, stimulus generator 228, and simulator 232 as further explained below.

The memory instance 204 is an input layout database which may be generated by a memory compiler team using a layout editor (not shown) in accordance with any of a plurality of symbolic layout methodologies in order to accommodate different performance objectives. The extraction tool 208 may be implemented by any of a variety of commercially available layout parameter extraction programs (e.g., Dracula Flat and Hierarchical layout parameter extraction (LPE) available from Cadence Design Systems, Inc. of San Jose, Calif.). Layout extraction processes, which include computing and extracting key electrical parameters from a layout database, are computationally intensive. Therefore, it is desirable to reduce the amount of time and computing power required for extraction of the layout database. In one embodiment, the layout extraction tool 208 includes a layout synopsizing program which performs a layout synopsizing process on the input layout database representing an original IC design, and generates a synoptic layout database which includes geometric data representing less than all sub-circuits of the original IC design. Less computing power is required by the extraction tool 208 to extract layout parameters from the synoptic layout database than is required to extract layout parameters from the full memory instance 204. An example of a layout synopsizing program which may be used with the layout extraction tool 208 is described in applicants co-pending U.S. patent application No. 09/267,333 entitled "LAYOUT SYNOPSIZING PROCESS FOR EFFICIENT LAYOUT PARASITIC EXTRACTION AND CIRCUIT SIMULATION IN POST-LAYOUT VARIFICATION", filed on Mar. 12, 1999.

The automatic circuit reduction tool 224 receives the circuit netlist 210 extracted from the memory instance 204 which defines a circuit instance of a memory compiler. The automatic circuit reduction tool 224 generates a critical path netlist. In one embodiment, the automatic circuit reduction tool 224 is implemented by the system described in U.S. patent application Ser. No. 08/766,358, filed Dec. 13, 1996, entitled "Method for Simulating ULSI/VLSI Circuit Designs" which is incorporated herein by reference. The automatic circuit reduction tool 224 receives layout extracted data and automatically determines circuit characteristics of critical path segments to a high degree of accuracy by taking into account RC coupling effects between the critical path segments and other segments coupled thereto. For example, consider that the address inputs $A_1, A_2, A_3, \ldots, A_N$ (FIG. 4) are connected to signal path segments 151 (FIG. 4) which are RC coupled with the first critical path segment 150. In this case, input signals applied to the address inputs $A_1, A_2, A_3, \ldots, A_N$ (FIG. 4) effect the circuit performance of the first segment 150 (FIG. 4) connected to the first address input $A_0$ of the address decoder, and the RC coupling effects of these signals are taken into account by the automatic circuit reduction tool 224 in generating the critical path netlist 240. This provides for improved accuracy in circuit simulation and in characterizing timing parameters.

The timing parameter templates stored in the database 214 are generated by a user of the memory characterization tool 202 using a graphical user interface based on a data sheet. The data sheet may be provided by the memory compiler team. The timing parameter templates include: at least one script file having memory characterization instructions for execution by the circuit simulation manager 220 for orchestrating an automatic memory characterization process performed by the memory characterization system 202 as further explained below; and at least one specification file associated with at least one timing characteristic to be determined for the circuit instance. Each of the specification files includes a plurality of input signal parameters defining a plurality of input signals to be applied to selected input nodes of the circuit instance, and a plurality of output loading parameters defining a plurality of output loads to be applied to selected output nodes of the circuit instance.

The stimulus generator 228 is responsive to the input signal parameters and operative to generate a stimulus file based on the input signal parameters for applying the defined input signals to the memory circuit instance during a simulation by the simulator 232. The circuit simulation manager 220 is operative to access the timing parameter database, and to execute at least a portion of the memory characterization instructions as further explained below, and to generate an updated critical path netlist based on the output loading parameters. The updated critical path netlist and the stimulus file are both adapted for use in simulation of the circuit instance by the simulator 232. Any standard type of simulator 232 may be used in accordance with the present invention. Examples of simulators which may be used in the memory characterization tool 202 include HSPICE™, PowerMill™, TimeMill™, StarSim™, and SPICE tools.

Figure 6A:
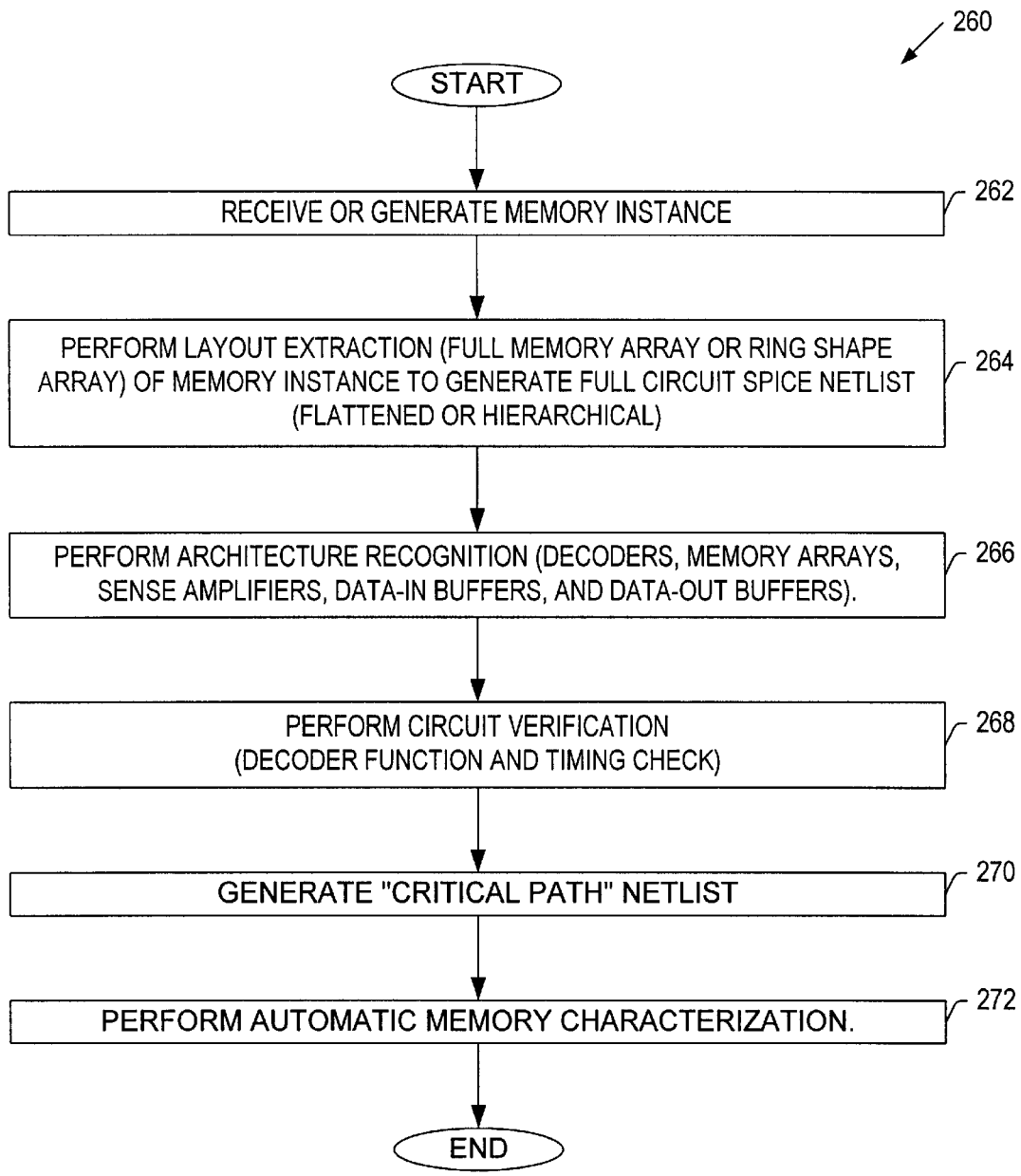
FIG. 6A is a flow diagram illustrating a general process for using the memory characterization system of FIG. 5.

FIG. 6A shows a flow diagram illustrating a process 260 in accordance with the present invention for characterizing a memory instance. The process 260 begins with the step 262 in which the layout extraction tool 208 (FIG. 5) receives a memory instance 204. In step 264, the layout extraction tool 208 performs layout extraction (fill memory array or ring-shape array) of the memory instance to generate a full circuit netlist (e.g., a flattened or hierarchical netlist). Note that the netlist may be very large and may include several hundred megabytes of data. Such a netlist is too large for accurate circuit simulation like HSPICE. In step 266, the automatic circuit reduction tool 224 (FIG. 5) performs architecture recognition of sub-circuits of the memory circuit extracted in step 264. Subcircuits of the memory circuit include decoders, memory arrays, sense amplifiers, data input buffers, and data output buffers. In step 264, the automatic circuit reduction tool 224 (FIG. 5) performs circuit verification including decoding functions and timing checks of the memory circuit. In step 270, the automatic circuit reduction tool generates the critical path netlist 240 (FIG. 5). From step 270, the process proceeds to step 272 in which the circuit simulation manager 220 (FIG. 5) orchestrates an automatic memory characterization process for the critical path netlist as further described below.

Figure 6B:
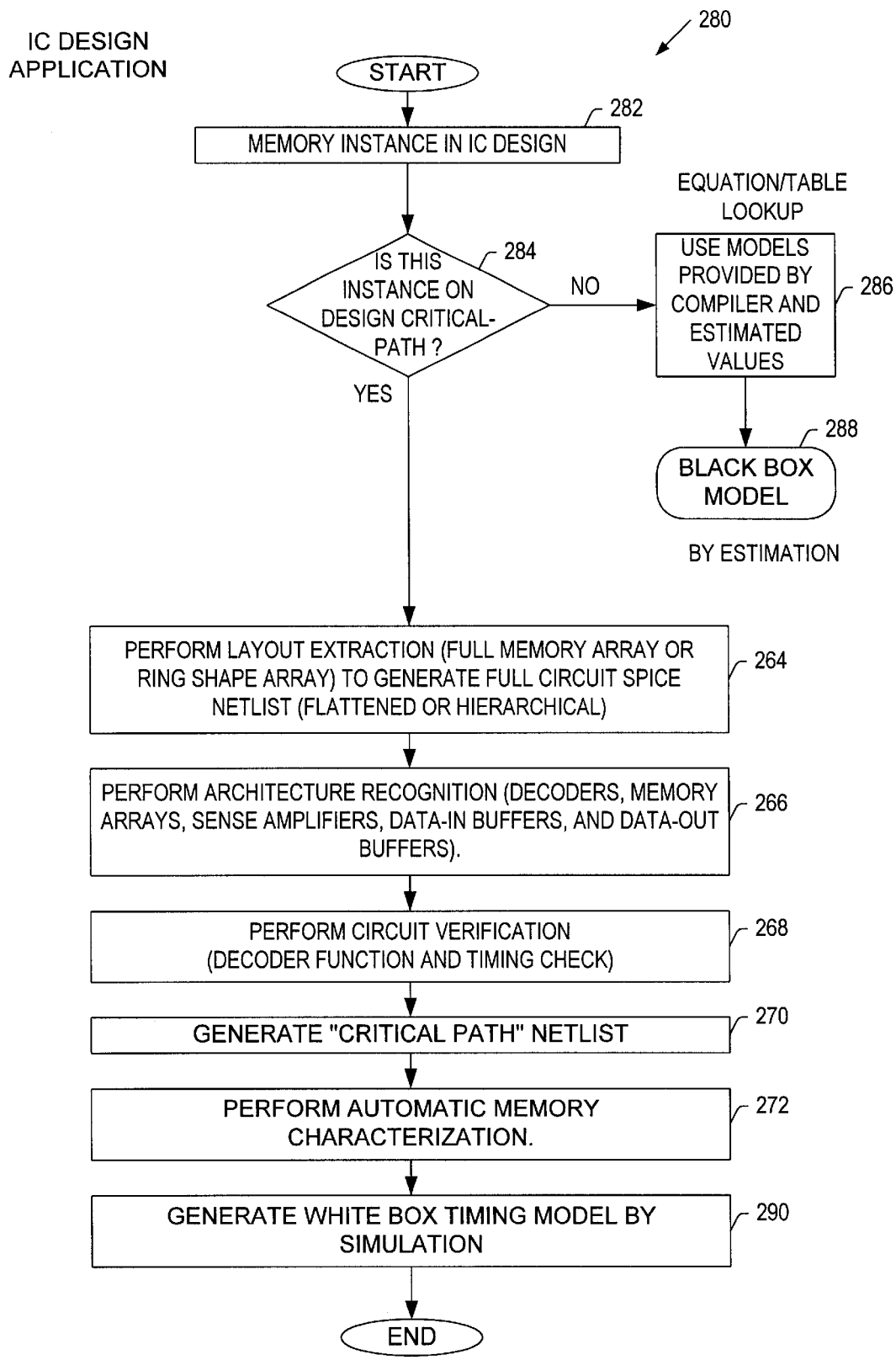
FIG. 6B is a flow diagram illustrating a process for use of the memory characterization system of FIG. 5 by an IC designer.

FIG. 6B shows a flow diagram illustrating an IC design application process at 280 which provides one embodiment of a use model for the memory characterization tool 202 (FIG. 5). The process 280 begins with step 282 in which a memory instance to be used in an integrated circuit design is received in the form of layout data In step 284, the user determines whether the memory instance is on a design critical path, and if not, the process proceeds to step 286 in which use models provided by the compiler are used to determine a black box model 288 by estimation.

Alternatively, if it is determined at 284 that the memory instance is on a design critical path, the process proceeds to execute steps 264, 266, 268, 270 and 272 as described above after which the process executes step 290 to generate a white box timing model by simulation.

Figure 6C:
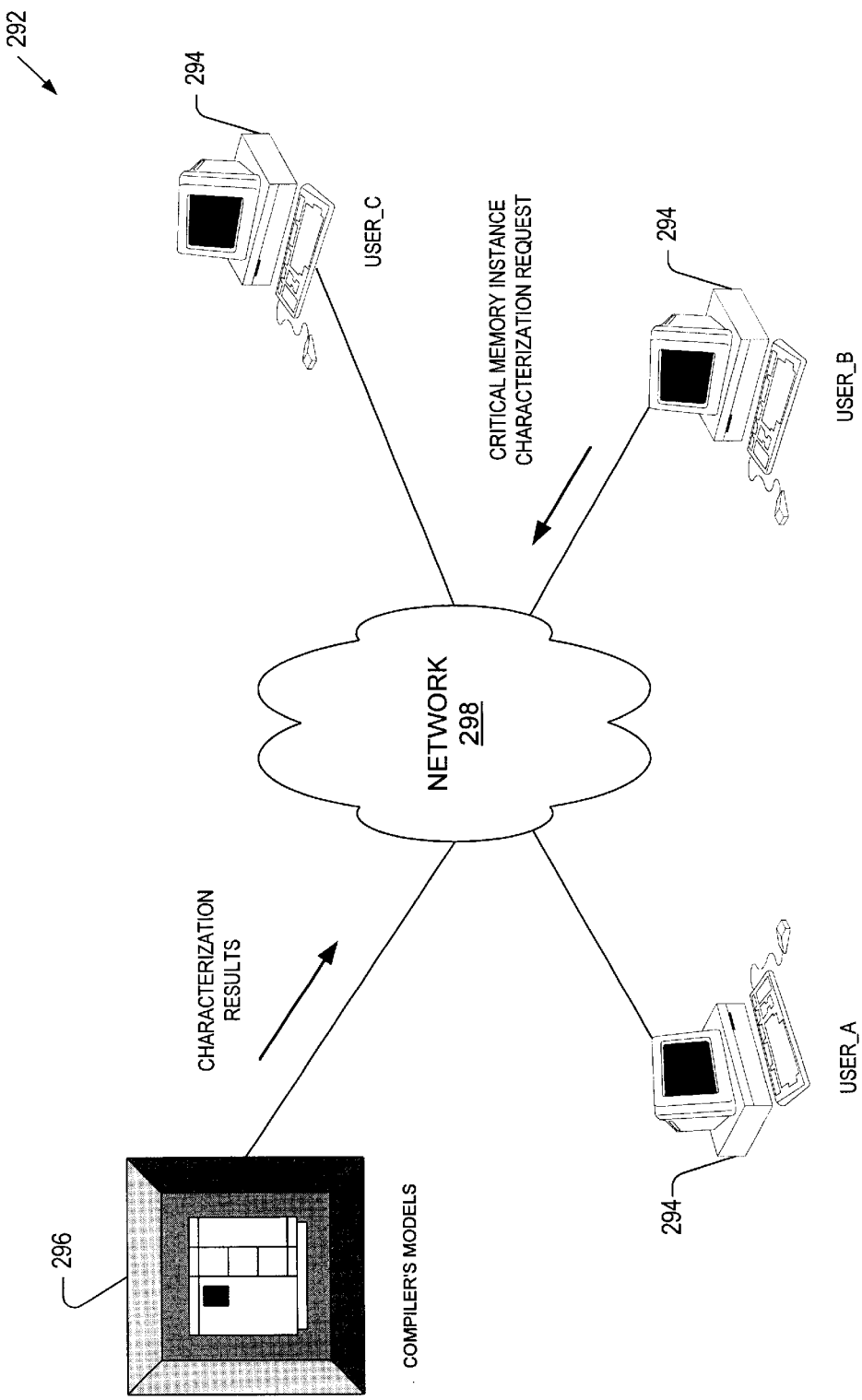
FIG. 6C is a generalized block diagram illustrating a network system providing for shared use of the memory characterization system by an IC designer and a third party memory characterization service provider such as a memory compiler vendor.

FIG. 6C shows a generalized block diagram illustrating a network system at 292 providing for shared use of the memory characterization system 200 (FIG. 5) by an IC designer and a third party memory characterization service provider. A plurality of memory instance users (e.g., IC designers) designated USER_A, USER_B, and USER_C are provided with IP blocks, or memory instances, along with associated equations and tables for black box timing models by a memory compiler team. One of the users may determine that a particular memory instance is to be used on a critical path through an IC, and may further determine that a white box, or accurately simulated and characterized, timing model is required for the particular critical path memory instance. In this case, the user may use an associated computer system 294 to send a request for a critical memory instance characterization to a third party memory characterization service provider using a computer system 296 via a network 298. In varying embodiments of the present invention, the network 298 may be any communications network such as a local area network, an intranet, or an internet protocol (IP) network (e.g., the Internet). The third party memory characterization service provider (e.g., the memory compiler team that provided the critical IP block) then uses the memory characterization system 200 (FIG. 5) to generate a white box timing model for the particular critical memory instance, and provides the characterization results back to the requesting one of the users via the IP network 298.

Figure 6D:
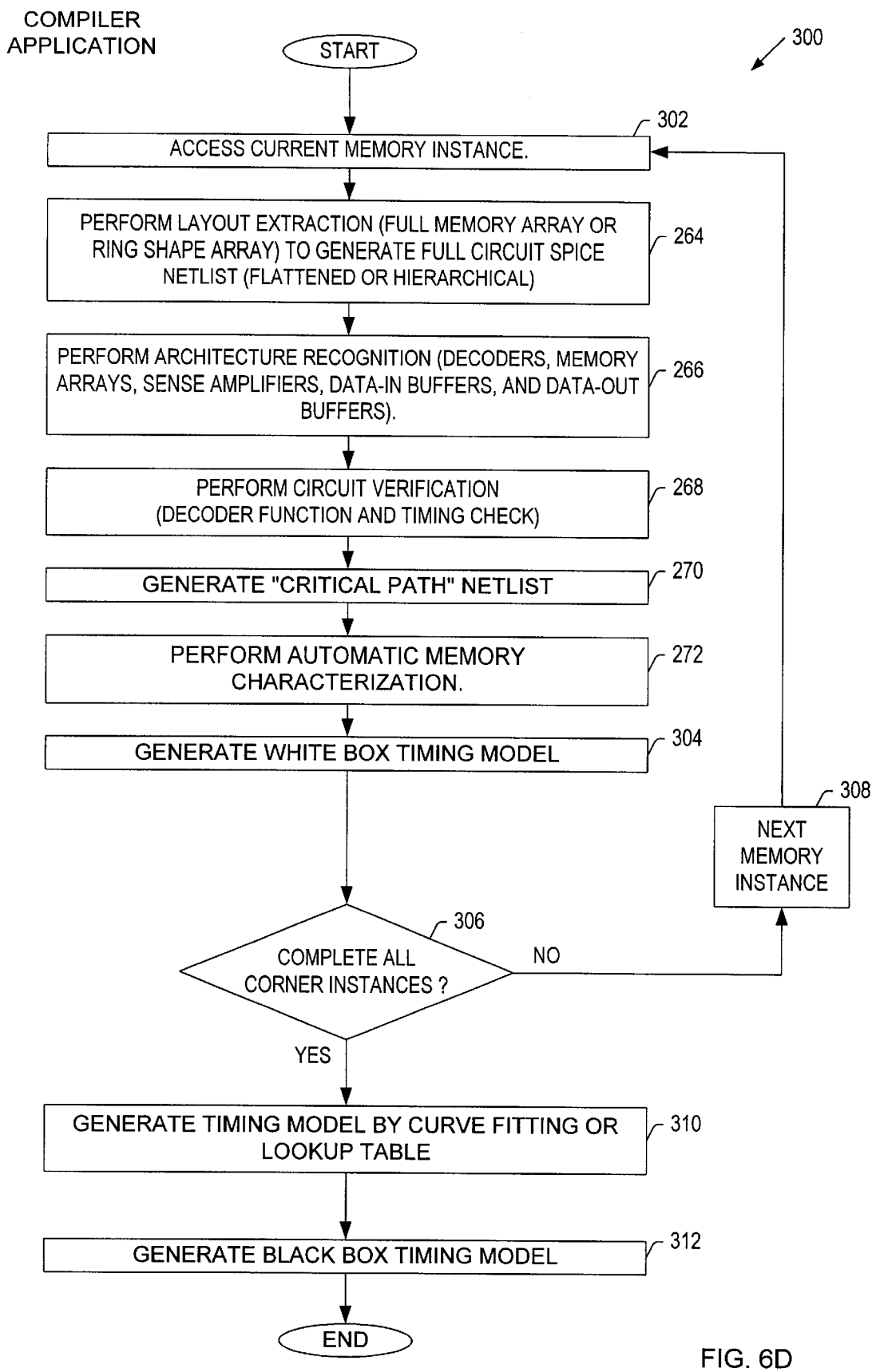
FIG. 6D is a flow diagram illustrating a process for use of the memory characterization system by a memory compiler.

FIG. 6D shows a flow diagram at 300 illustrating a compiler application process at 300 providing a second embodiment of a use model for the memory characterization tool 202 (FIG. 5) of the present invention. The process 300 begins with step 203 in which a current memory instance in accessed. From step 302, the process proceeds to execute steps 264, 266, 268, 270 and 272 as described above, after which the process proceeds to step 204 to generate a white box timing model based on the results of the automatic memory characterization step 272. From step 304, the process proceeds to 306 at which it is determined whether all corner instances of the memory design have been processed, and if not, the process proceeds to step 308 in which a next memory instance is received after which the process repeats steps 302 through 304 as described above.

Alternatively, if it is determined at 306 that all corner instances have been characterized, the process proceeds to step 310 to generate a timing model by curve fitting or using a look up table. From step 310 the process proceeds to step 312 in which a black box timing model is generated.

Figure 7A:
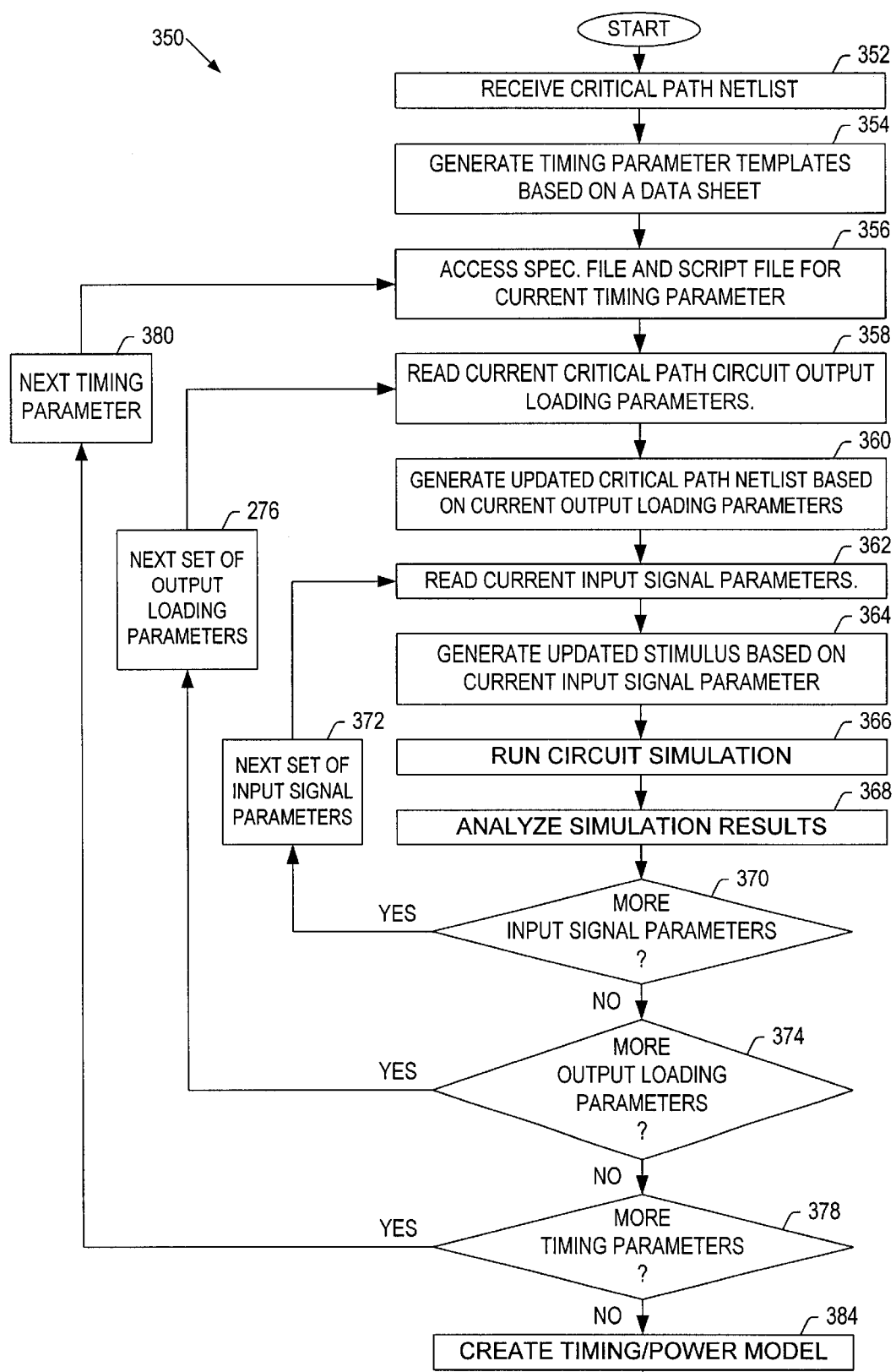
FIG. 7A is a flow diagram illustrating one embodiment of an automatic memory characterization process in accordance with the present invention as performed by the memory characterization system of FIG. 5.

FIG. 7A shows a flow diagram illustrating steps of the automatic memory characterization process 272 (FIG. 6A) at 350. The automatic characterization process 350 begins with step 352 in which the critical path netlist 240 (FIG. 5) is received by the circuit simulation manager 220 (FIG. 6). From step 352, the process proceeds to step 354 in which timing parameter templates 214 (FIG. 5) are generated based on the data sheet 206 (FIG. 5). In one embodiment, a graphical user interface is provided for the user to generate the timing parameter templates based on the data sheet.

From step 354, the process proceeds to step 356 in which the circuit simulation manager 220 (FIG. 5) accesses a specification file and a script file from the timing parameter template database 214 (FIG. 5) for a first timing parameter. As mentioned above, the timing parameters include setup time, hold time, and pulse width, etc. Examples of specification files and script files for particular ones of the timing parameters are further described below. From step 356, the process proceeds to step 358 in which the circuit simulation manager reads current critical path circuit output loading parameters from the current specification file. The memory characterization tool of the present invention provides or characterizes timing parameters for a plurality of output loading values and a plurality of different input signal characteristics.

From step 358, the process proceeds to step 360 in which the circuit simulation manager generates an updated critical path netlist 242 (FIG. 5) based on the current output loading parameters. In step 362, the circuit simulation manager reads a current input signal parameter, which in the first iteration is an initial input signal parameter. From step 362, the process proceeds to step 364 in which the circuit simulation manager 220 (FIG. 5) controls the stimulus generator 228 (FIG. 5) to generate an updated stimulus file based on the current input signal parameters. In step 366, the circuit simulation manager controls the simulator 232 (FIG. 5) to run a simulation for the current memory instance based on the current stimulus and the current updated critical path netlist for the current output loading parameters. As a result of running the circuit simulation in step 366, characterized timing parameters are generated.

From step 366, the process proceeds to step 368 in which simulation results are analyzed, and timing parameters are extracted. Depending on the type of simulator used to implement the simulator 232 (FIG. 5), different types of parameters will be generated by the simulator as a result of the circuit simulation. It may or may not be necessary to perform calculations to extract the desired timing parameters based on the simulation results. Also, the data format of the timing parameters may be converted.

From step 368, the process proceeds to step 370 at which it is determined whether or not there are more input signal parameters for characterizing the current timing parameter, and if so, the process proceeds to step 372 in which a next set of input signal parameters are read by the circuit simulation manager from the timing parameter templates 214 (FIG. 5), after which steps 362 through 368 are repeated as described above. Alternatively, if it is determined at 370 that there are no more input signal parameters, the process proceeds to 374 at which it is determined whether or not there are more output loading parameters for characterizing the current timing parameter, and if so, the process proceeds to step 376 in which a next set of output loading parameters is accessed from the timing parameter template database 214 (FIG. 5), after which the process repeats steps 358 through 374 as described above.

Alternatively, if it is determined at 374 that there are no more output loading parameters, the process proceeds to step 378 at which it is determined whether or not there are more timing parameters to be characterized, and if so, the process proceeds to step 380 in which the circuit simulation manager accesses a specification file associated with a next one of the timing parameters, after which the process repeats steps 356 through 378 as described above. Alternatively, if it is determined at step 378 that there are no more timing parameters to be characterized, the process proceeds to step 384 in which a timing/power model is created and stored in a database. In one embodiment of the present invention, the timing/power model is generated and stored in a ".lib" file format, which is defined by Synopsis Corporation.

FIG. 7B shows a table diagram at 388 illustrating setup time characterization results generated by the automatic memory characterization system 202 (FIG. 5) as a function of varying slew rate values of an input clock signal, and varying slew rate values of an address input signal.

FIG. 7C shows a table diagram at 392 illustrating hold time characterization results generated by the automatic memory characterization system 202 (FIG. 5) as a function of varying slew rate values of an input clock signal, and varying slew rate values of an address input signal.

FIG. 7D shows a table diagram at 396 illustrating access time characterization results generated by the automatic memory characterization system 202 (FIG. 5) as a function of varying output loading parameters, and varying transition times of an input clock signal.

Table 1 below illustrates a memory characterization (MC) running command indicating a particular script file for execution by the automatic circuit reduction tool 224 (FIG. 5), a specification file used for generating a stimulus file and an updated critical path netlist based on input signal parameters and output loading parameters for the purpose of characterizing access time, a name for a particular memory instance 204 (FIG. 5) for which timing parameters are to be characterized, a particular netlist file 210 (FIG. 5) of the particular memory instance, and an output file for storing access time parameters determined by the memory characterization system 202. So, table 1 illustrates files operated upon by components of the memory characterization system 200 (FIG. 5) under control of the circuit simulation manager 220 (FIG. 5) for the purpose of automatically characterizing access time of a memory instance.

TABLE 1

Access Time Example
Running Command: MC

% MC  -script access.sh -spec access.spec -instance dp32x8m2
       -o dp32x8m2.acc_tbl
Files Descriptions

| | |
|---|---|
| access.sh | script file for Automatic circuit reduction tool |
| access.spec | specification file of access time for Memory characterization system |

TABLE 1-continued

| | |
|---|---|
| dp32x8m2 | instance name |
| dp32x8m2.sp | Spice netlist of the instance after layout extraction |
| dp32x8m2.acc_tbl | output file of Memory characterization system for access time |

Table 2 below illustrates details of a specification file used by components of the memory characterization system 200 (FIG. 5) under control of the circuit simulation manager 220 (FIG. 5) for the purpose of automatically characterizing access time of a memory instance.

TABLE 2

| | |
|---|---|
| define char_type access | ## define read/write addresses |
| define clock_cycle 10.0 | select AA[0] read_address |
| define rise_time 0.15 | select AA[1] read_address |
| define fall_time 0.15 | select AA[2] read_address |
| define vih 1.80 | select AA[3] read_address |
| define vil 0.00 | select AA[4] read_address |
| define sweep slewRate (0.2, 0.6, . . . | select AB[0] write_address |
| define sweep outLoad (0.0, 0.2, . . . | select AB[1] write_address |
|  | select AB[2] write_address |
| ## Set clock | select AB[3] write_address |
| select CLKA clock rise | select AB[4] write_address |
| select CLKB clock rise |  |
|  | ## define data I/O pins |
| ## define read/write enable | select DB[0] data_in 0 |
| select CENA read_enable 0 | select DB[7] data_in 1 |
| select CENB write_enable 0 | select QA[0] data_out |
|  | select QA[7] data_out |

Table 3 below illustrates details of a script file executed by the automatic circuit reduction tool 224 (FIG. 5) of the memory characterization system 200 (FIG. 5) under control of the circuit simulation manager 220 (FIG. 5) for the purpose of automatically characterizing access time of a memory instance.

TABLE 3

DefinePattern corecell.sp
BuildMemory DP32X8M2
IncludeInSpice -f IncludeFile
SimulationCommand hspice
SelectActiveWordBySimulation -n -f saw1.out AA[<0:4>]=0 [CENA=0 CLKA=0] [CENA=0 CLKA=1]
SelectActiveWordBySimulation -n -f saw2.out AA[<0:4>]=1 [CENA=0 CLKA=0] [CENA=0 CLKA=1]
SpiceCut -f access.sp DB[0] QA[0] DB[7] QA[7]

Table 4 below illustrates details of simulation control specification files executed by the circuit simulation manager 220 (FIG. 5) for controlling associated components of the memory characterization system 200 (FIG. 5) for the purpose of characterizing access time as a function of slew rate of address input signals and output loading as described above.

TABLE 4

Control HSPICE running
 ## Hspice section
  define spice_model_lib      umc018.hsplib TT
  define hspice option "nomod post pivot=10 itll=600"
 Control Sweeps of Input Slew Rate and Output Loading
  ## Sweeps
   define sweep slewRate (0.2, 0.6, . . .)
   define sweep outLoad (0.0, 0.2, . . .)

Table 5 below illustrates instruction of an HSPICE run file generated by the circuit simulation manager 220 (FIG. 5) for the purpose of simulating access timing parameters of a memory instance.

TABLE 5

| | |
|---|---|
| .lib umcO18.hsplib TT | VCENA CENA GND PWL . . . |
| .include access.spi | VCENB CENB GND PWL . . . |
| # access.spi generated by Automatic circuit reduction tool | .MEASURE TRAN acc_QA[7]_CLKB TRIG +at=CLKB_rise1 TARG V(QA[7]) VAL='vih/2' |
| .OPT nomod post | +cross=1 TD=CLKB_rise1 |
| .PARAM OUTLOAD=O.2PF | .MEASURE TRAN acc_QA[7]_CLKA TRIG |
| CQA[7] QA[7] 0 OUTLOAD | +at=CLKA_rise1 TARG V(QA[7]) VAL='vih/2 |
| CQA[0] QA[0] 0 OUTLOAD | cross=1 TD=CLKA_rise1 |
| .PARAM Tr=O.15ns | .MEASURE TRAN acc_QA[9]_CLKB TRIG |
| .PARAM Tf=O.15ns | +at=CLKB_rise1 TARG V(QA[0]) VAL='vih/2' |
| VDB[0] DB[0] GND PWL . . . | +cross=1 TD=CLKB_rise1 |
| VDB[7] DB[7] GND PWL . . . | .MEASURE TRAN acc_QA[0]_CLKA TRIG |
| VAA[0] AA[0] GND PWL . . . | +at=CLKA_rise1 TARG V(QA[0]) VAL='vih/2' |
| VAA[1] AA[1] GND PWL . . . | +cross=1 TD=CLKA_rise1 |
| . . . | .TRAN 0.5ns 66.15ns |
| VAA[1] AA[1] GND PWL | .PARAM vil=0.00 |
| . . . | .PARAM vih=1.80 |
| VCLKB CLKA GND PWL | .END |
| VCLKB CLKB GND PWL | |

Table 6 below illustrates a set of netlist files, specification files, and script files executed by the components of the memory characterization system 200 (FIG. 5) under control of the circuit simulation manager 220 (FIG. 5) for the purpose of automatically characterizing setup and hold time of a memory instance.

TABLE 6

Running Command: MC

| | |
|---|---|
| % MC -script aa_setup_hold.sh | -spec aa_setup_hold.spec |
| -instance dp32x8m2 | -o dp32x8m2.aa_setup_hold_tbl |

Files Descriptions

| | |
|---|---|
| aa_setup_hold.sp | script file for Automatic circuit reduction tool |
| aa_setup_hold.spec | specification file for Memory characterization system |
| dp32x8m2 | instance name |
| dp32x8m2.sp | Spice netlist of the instance after layout extraction |
| dp32x8m2.aa_setup_hold_tbl | output file for setup and hold time |

Table 7 below illustrates instructions of a specification file executed by the circuit simulation manager 220 (FIG. 5) for the purpose of automatically characterizing setup and hold time of a memory instance.

TABLE 7

| | |
|---|---|
| define char_type setup | ## defines for setup time |
| define clock_cycle 10.0 | define setup_range 10 |
| define rise_time 0.20 | define setup_goal 1 |
| define fall_time 0.20 | setpin AA[0] high |
| define vih 1.80 | setpin AA[1] high |
| define vil 0.00 | setpin AA[2] high |
| define sweep slewRate (0.2, 0.6, . . . | setpin AA[3] high |
| define sweep outLbad (0.0, 0.2, . . . | setpin CENA low |
| ## Hspice section | select AA[4] setup in RISE |
| define spice_model_lib umc018.hsplibTT | select CLKA setup clock RISE |
| define hspice option "nomod post pivot=10 itlI=600" | |

Table 8 below illustrates instructions of a script file executed by the automatic circuit reduction tool 224 (FIG. 5) for the purpose of automatically characterizing setup and hold time of a memory instance.

TABLE 8

DefinePattern corecell.sp
BuildMemory DP32X8M2
IncludeinSpice -f IncludeFile

TABLE 8-continued

SimulationCommand hspice
SetPin CLKA clock rise
SelectActiveWordBySimulation -buffer 1 -n AA[<0:4>]=1 [CENA=0 CLKA=0] [CENA=0 CLKA=1]
NetlistSetup -m -f aa_setup_hold.sp AA[4] SPICECUT_BUFFER1

Figure 1:
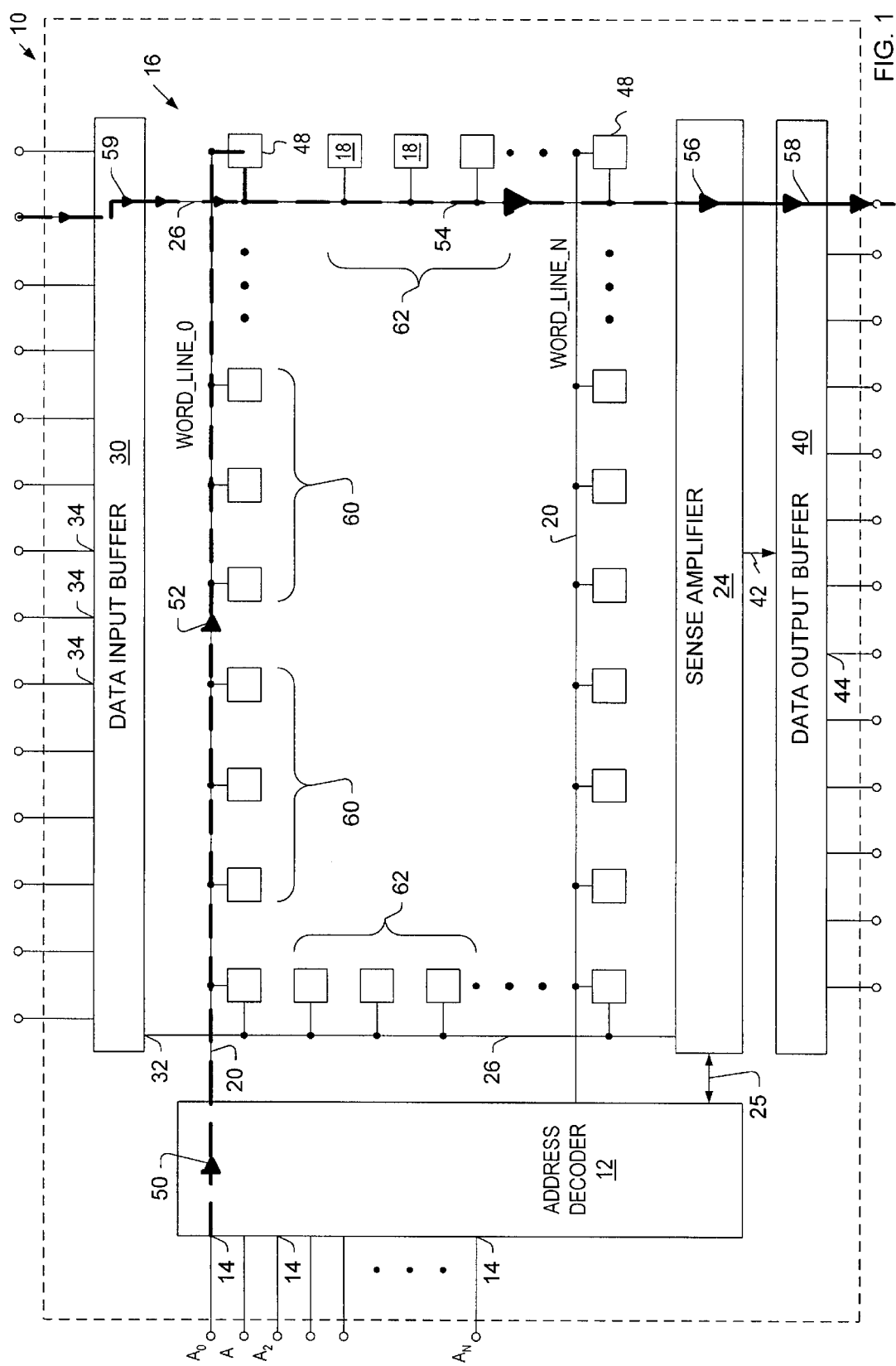
Figure 2:
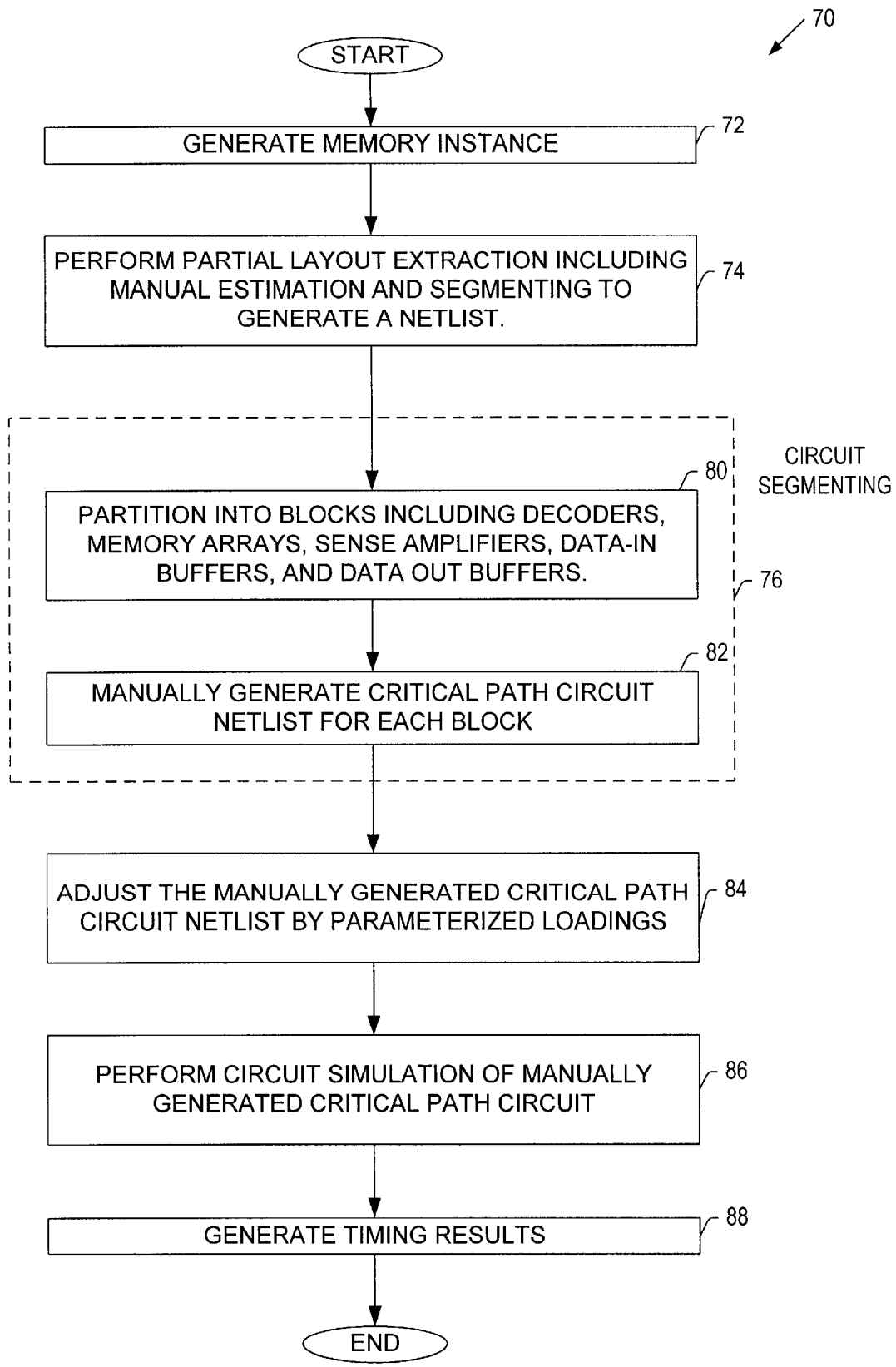
FIG. 2 shows a block diagram illustrating a prior art semi-manual process of characterizing timing parameters for an instance of a particular memory circuit compiler.
Figure 3:
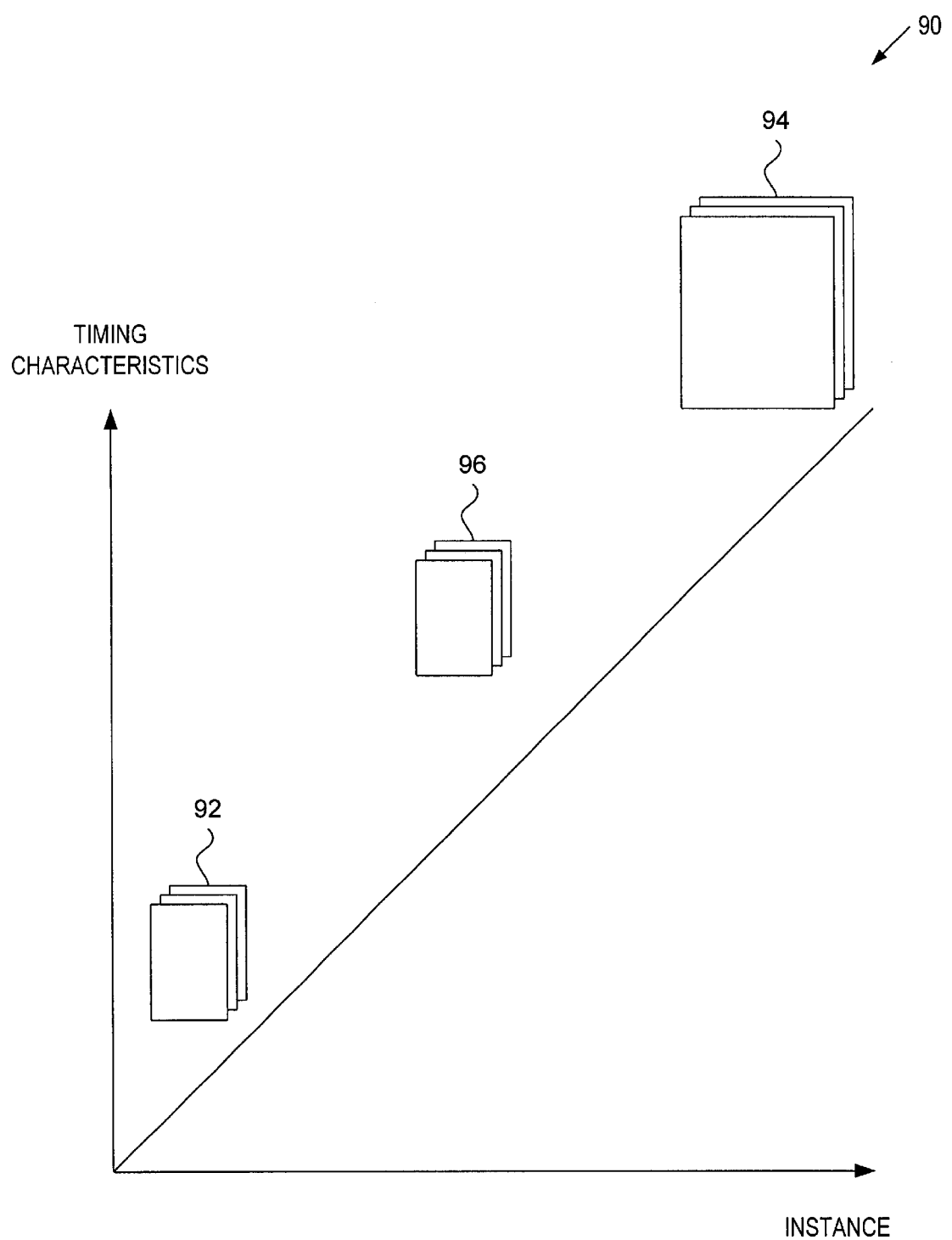
FIG. 3 shows a block diagram generally illustrating a memory instance timing parameter interpolation diagram.

Note that user specified names for selected ones of the word lines 20 (FIG. 1) of the memory circuit are stored in a program buffer designated "-buffer 1" which is later used in the script file of table 8 in the instruction "select active word by simulation". This feature provides an advantage in that the user does not have to know the exact name of the word lines referred to in order to characterize the setup and hold time.

Table 9 below illustrates instructions of an HSPICE run file generated by the circuit simulation manager 220 (FIG. 5) for the purpose of simulating setup and hold timing parameters of a memory instance by the simulator.

TABLE 9

| | |
|---|---|
| .lib umc018.hspiib TT | $ Clock pin: CLKA |
| .include aa_setuphold.spi | VCLKA CLKA 0 PWL 0.0ns vil |
| | 6.00ns vil |
| # aa_setup_hold.spi generated by | +'6.00ns÷Trclk' vil |
| Automatic circuit reduction tool | $ Input pin: AA[4] |
| .OPT nomod post | VAA[4] AA[4] 0 PWL 0.0ns vil |
| .param vil=gnd_value | '1.00ns+Tdelay' |
| .param vih=vdd_value | +vil '1.00ns+Trin+Tdelay' vih |
| .PARAM Tr=0.20000ns | .PARAM Tdelay=Opt1 (0.0010ns, |
| .PARAM Tf=0.20000ns | 0.0010ns, 10.00ns) |
| .PARAM Trin=0.20000ns | .TRAN 0.5n 1 3.50ns Sweep |
| | Optimize = Opt1 |
| .PARAM Tfin=0.20000ns | + |
| .PARAM Trclk=0.20000ns | Result = MinMax Vout |
| .PARAM Tfclk=0.20000ns | + |
| $ Fixed voltages | Model = OptMod |
| V13 CENA 0 vil | MEASURE TRAN MinMaxVout |
| | Max |
| V6 AA[3] 0 vih | V(N46_0) |
| V5 AA[2] 0 vih | +goal='0.9*vih' from=3.50ns |
| | to=13.50ns |
| V4 AA[1] 0 vih | .MODEL OptMod Opt Method = |
| | BiSection |
| | .MEASURE tran set_AA[4]_CLKA |
| | Trig |
| | V(AA[4]) |
| | +VaI='vih/2' Td=1.00ns cross=1 |
| | Targ |
| | +V(CLKA) Val='vih/2' Td=1.00ns |
| | cross=1 |
| | .OPTION optlst=1 post nomod |
| | .END |

Table 10 below illustrates memory characterization running commands indicating a set of netlist files, specification files, and script files executed by the associated components of the memory characterization system 200 (FIG. 5) under control of the circuit simulation manager 220 (FIG. 5) for the purpose of automatically characterizing minimum pulse width timing parameters of a memory instance.

TABLE 10

Running Command: MC

| | | |
|---|---|---|
| % MC | -script clka_mpw.sh | -spec cklajnpw.spec |
| | -instance dp32x8m2 | -o dp32x8m2.clka_mpw_tbl |
| Files Descriptions | | |
| clka_mpw.sh | script file for Automatic circuit reduction tool | |
| clkampw.spec | specification file for Memory characterization system | |
| dp32x8m2 | instance name | |
| dp32x8m2.sp | Spice netlist of the instance after layout extraction | |
| dp32x8m2.clka_mpw_tbl | output file for minimum pulse width | |

Table 11 below illustrates a specification file executed by the circuit simulation manager 220 (FIG. 5) for the purpose of automatically characterizing minimum pulse width of a memory instance.

TABLE 11

| | |
|---|---|
| define char_type minwd | |
| define clock cycle 10.0 | ##defines for minwd time |

TABLE 11-continued

| | |
|---|---|
| define rise_time 0.1 | define minwd range 10 |
| define fall_time 0.1 | define minwd₁goai 1 |
| define vih 1.80 | setpin AA[0] high |
| define vii 0.00 | setpin AA[1] high |
| | setpin AA[2] high |
| | setpin AA[3] high |
| ## Hspice section | setpin AA[4] high |
| | setpin CENA low |
| define spice_model_lib | |
| umc018.hsplib TT | select CLKA minwd_clock RISE |
| define hspice option "nomod post | |
| pivot=10 itll=600" | |

Table 12 below illustrates instructions of a script file to be executed by the automatic circuit reduction tool 224 (FIG. 5) under control of the circuit simulation manager 220 (FIG. 5) for the purpose of automatically characterizing minimum pulse width of a memory instance.

TABLE 12

DefinePattern corecell.sp
BuildMemory DP32X8M2
IncludeInSpice -f IncludeFile
SimulationCommand hspice
setpin CLKA clock rise
SelectActiveWordBySimulation -buffer 1 -n AA[<0:4>]=1
[CENA=0 CLKA=0] [CENA=0 CLKA=1]
NetlistMinWd -m -f clka_mpw.sp SPICECUT_BUFFER1

Table 13 below illustrates exemplary results of the automatic characterization process for minimum pulse width of a memory instance by the automatic memory characterization tool 202 (FIG. 5).

TABLE 13

The Minimum Pulse Width ##

CLKA = 1.1723E−10

Table 14 below illustrates script files for initiating fully automated running of the automatic memory characterization tool 202 (FIG. 5) for instance characterization.

TABLE 14

'Push-Button' solution for characterizing
    Select timing parameters
    Complete set, ususally 20~30 parameters
Example:
    Running Script: dpsram_characterization.sh
        %MC  -script access.sh         -spec access.spec
                  -instance dp32x8m2     -o dp32x8m2 acc_tbl
        %MC  -script aa_setup_hold.sh  -spec aa_setup_hold.spec
                  -instance dp32x8m2     -o dp32x8m2 aa_setup_hold_tbl
        %MC  -script clka_mpw.sh     -spec clka_rnpw.spec
                  -instance dp32x8m2     -o dp32x8m2 clka_mpw_tbl . . .

The automatic memory characterization system 202 also provides timing parameter optimization functions for optimizing timing parameters including setup time, hold time, and pulse width. For purposes of teaching the timing parameter optimization process of the present invention, a description is provided below for optimizing the setup time parameter. Functions for optimizing the other optimization parameters will be understood in light of the below description of the setup time optimization process.

FIG. 8 shows a block diagram generally illustrating a latch circuit 500 that provides a model for a selected critical circuit path segment through a portion of the memory circuit 100 (FIG. 4) such as a portion of the decoder 112 (FIG. 4), or a portion of the array 116 (FIG. 4). The latch circuit 500 includes: a data input 502 for receiving a data input signal designated $D_{IN}$ representing an input signal applied to a selected one of the input pins 134 (FIG. 4) of the memory circuit; a clock input 504 for receiving a clock input signal designated CLK representing an input clock signal applied to the memory circuit; and a data output 506 providing a data output signal designated $D_{OUT}$ representing an output signal provided by a selected one of the output pins 144 (FIG. 4) of the memory circuit.

FIG. 9 shows a timing diagram at 510 illustrating signal relationships defining a setup time parameter associated with a selected signal path through the memory circuit (e.g., a segment associated with a selected memory cell 118 of FIG. 4, or a path segment through the decoder 112 of FIG. 4) as modeled by the latch circuit 500 (FIG. 8). Setup time is defined as a function of the associated clock signal CLK (FIG. 8) represented by a waveform 514, and the associated data input signal $D_{IN}$ (FIG. 8) represented by a waveform 512. As shown, the data input signal $D_{IN}$ is initiated at a time $T_1$, and the clock signal CLK is initiated at a later time $T_2$. A parameter for determining setup time is defined by the difference between the time $T_1$ at which the data input signal $D_{IN}$ is initiated, and the time $T_2$ at which the clock signal CLK is initiated. The optimal setup time associated with a particular path segment is defined by the minimum time required between initiation of the data input signal $D_{IN}$ and initiation of the clock signal CLK that results in a valid data output signal $D_{OUT}$ (FIG. 8). As further explained below, the automatic memory characterization system of the present invention provides for an iterative simulation process using a binary search method for optimizing this timing parameter.

FIG. 10 shows a bisection model diagram at 520 illustrating a process for determining an optimal setup time in accordance with a binary search method. A binary search setup time optimization method may be performed in conjunction with the simulation step 366 (FIG. 7A). A curve 522 representing the validity of a criteria parameter (e.g., max function of data output signal $D_{OUT}$ in a time period) is plotted as a function of an optimization parameter (e.g., the parameter for determining setup time) which is represented on the horizontal axis. A critical point in the plot is represented by a validity value 524 above which the criteria parameter is assumed to be valid, and below which the criteria parameter is assumed to be invalid. In the depicted example, a criteria parameter (CP value) is determined to be a failure at an initial optimization parameter value (OP value) designated OP_1, and the validity of criteria parameter is determined to be successful at a second OP value designated OP_2 that is greater than the initial OP value OP_1. In accordance with the bisection method, the validity of criteria parameter is determined at a third OP value OP_3 that is determined as the sum of the first and second OP values OP_1 and OP_2 divided by 2. In this example, the validity of criteria parameter is also determined to have failed at the third OP value OP_3, and the validity of criteria parameter is next determined at a fourth OP value OP_4 that is determined as the sum of the second and third OP values OP_2 and OP_3 divided by 2. Criteria parameter is determined to be successful at OP_4, and the validity of criteria parameter is next determined at a fifth OP value OP_5 that is determined as the sum of the third and fourth OP values OP_3 and OP_4 divided by 2. The validity of criteria parameter is also determined to be successful at OP_5, and OP_5 is assumed to be the optimal setup time when the percentage difference between the value OP_4 and the value OP_5 is less than a predetermined threshold value (e.g., 10e-3). Based on the value OP_5, the minimum time required between initiation of the associated data input signal $D_{IN}$ (FIG. 8) and initiation of the clock signal CLK (FIG. 8) that results in a valid data output $D_{OUT}$ (FIG. 8) is the setup time. The setup time depends upon the circuit design and the RC characteristics of the circuit.

Figure 11A:
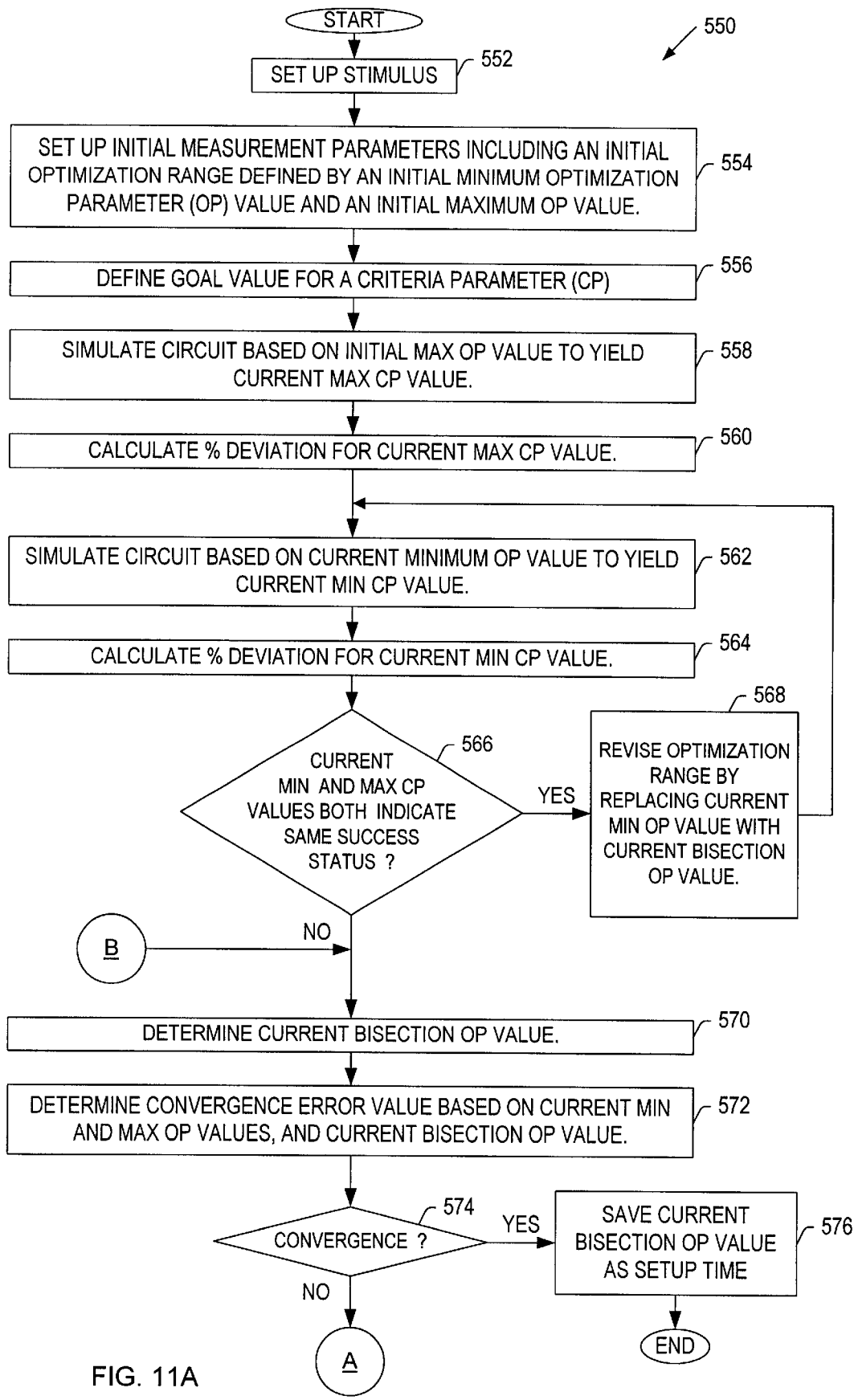
FIGS. 11A and 11B are flow diagrams illustrating a timing parameter optimization process for automatically optimizing timing parameters of a plurality of memory instances in accordance with the present invention.

FIG. 11A shows a flow diagram illustrating a time parameter optimization process as 550 for optimizing timing parameters of a memory instance in accordance with the present invention. The timing parameter optimization process 550 may be performed for optimizing a plurality of different timing parameters including setup time, hold time and pulse width. For purposes of describing the optimization process 550, the process is described for optimizing setup time. The process 550 is performed by the memory characterization system 200 (FIG. 5). The process 550 begins with step 552 in which a stimulus is generated by the stimulus generator 228 (FIG. 5) based on a specification file retrieved by the simulation manager 220 (FIG. 5) from the timing parameter templates database.

In step 554, the simulation manager 220 (FIG. 5) sets up an initial measurement parameter including an initial optimization range defined by an initial minimum optimization parameter (OP) value and an initial maximum OP value. As described above, setup time for a signal path segment through a memory circuit 100 (FIG. 4) may be modeled by the latch model 500 (FIG. 8) which is operative to receive a data input signal $D_{IN}$ represented by the wave form 512 (FIG. 9) and also responsive to the clock signal 514 (FIG. 9) which has a clock period. With reference to FIG. 10, the initial optimization range defined in step 554 may be defined by the range between an initial minimum OP value designated OP_1 and an initial maximum OP value designated OP_2. The initial optimization range may be defined as a maximum optimization range. Therefore, the initial maximum optimization parameter value is set to an anticipated maximum value. In the case of determining setup time, the initial maximum optimization parameter value is set equal to a value approximately equal to the clock cycle of the clock signal 514 (FIG. 9) that is applied to the latch model. The initial minimum optimization parameter value may be defined, for example, as being one-half of the clock cycle.

In step 556, a goal value is defined for a criteria parameter (CP). For the case of setup time, the criteria parameter is defined to be the value of the data output signal $D_{OUT}$ provided at the data output 506 (FIG. 8) of the latch model 500. As an example, for three-volt memory technology, the criteria parameter goal may be set to approximately 2.7 volts.

In step 558, the memory characterization system 200 (FIG. 5) simulates the circuit, that is a current instance of the memory circuit, based on the initial maximum OP value, that is OP_2 (FIG. 10), to yield a current maximum CP value.

In step 560, the circuit simulation manager 220 (FIG. 5) calculates a percent deviation for the current maximum criteria parameter value. The percent deviation calculated in step 560 is calculated in accordance with relationship (1) below.

$$\text{Percent deviation} = (\text{criteria parameter value} - \text{goal})/\text{goal}/ \quad (1)$$

In step 562, the memory characterization system 200 (FIG. 5) simulates the memory circuit based on the current minimum optimization parameter value, that is OP_1 (FIG. 10) to yield a current minimum criteria parameter value. In step 564, the circuit simulation manager 220 (FIG. 5) determines the percent deviation for the current minimum criteria parameter value based on relationship (1) above. If the percent deviation value is a negative value, the associated criteria parameter is deemed to fail for the associated optimization parameter value as illustrated in FIG. 10. As illustrated in FIG. 10, the initial minimum optimization parameter value OP_1 causes a failure in the associated initial minimum criteria parameter value. If the percentage deviation value is determined to be a positive value, then the associated criteria parameter is deemed to successful as indicated in FIG. 10. The terms "success" and "failure" indicate opposite results in the optimization process.

In step 566, the circuit simulation manager 220 (FIG. 5) determines whether the current minimum and maximum criteria parameter values both indicate a same success status. If one of the minimum and maximum criteria parameter values fail while the other succeeds, then it is determined that the line between success and failure has been crossed as indicated in FIG. 10.

However, if it is determined at 566 that the current minimum and maximum criteria parameter values both indicate the same success status, then the process proceeds to step 568 in which the circuit simulation manager revises the optimization range initially defined in step 554 above by replacing the current minimum optimization parameter value with a current bisection optimization parameter value. A current optimization parameter value is determined by relationship (2) below.

$$\text{Bisection OP value} = (\text{current min OP value} + \text{current max OP value})/2 \quad (2)$$

From step 568, the process proceeds to repeat steps 562 through 566 as described above. If alternatively, it is determined at 566 that the current minimum and maximum criteria parameter values do not indicate the same success status, the process proceeds to step 570 in which the circuit simulation manager determines a current bisection optimization parameter value between the current maximum and minimum optimization parameter values in accordance with relationship (2) above. From step 570, the process proceeds to step 572 in which the circuit simulation manager determines a convergence error value based on the current minimum and maximum optimization parameter values and also based on the current bisection optimization parameter value. The convergence error value is determined in accordance with relationship (3) below.

$$\text{Error} = |\text{current max OP value} - \text{current min OP value}|/\text{current bisection OP value} \quad (3)$$

From step 572, the process proceeds to step 574 in which the circuit simulation manager determines whether a convergence has occurred. Convergence is determined by determining whether the convergence error value is less than a predetermined error value. In an embodiment of the present invention, the predetermined error value is $10^{-3}$.

If it is determined at 574 that there is a convergence, the process proceeds to step 576 in which the circuit simulation manager saves the current bisection OP value as the optimized parameter value, that is as the setup time.

Figure 11B:
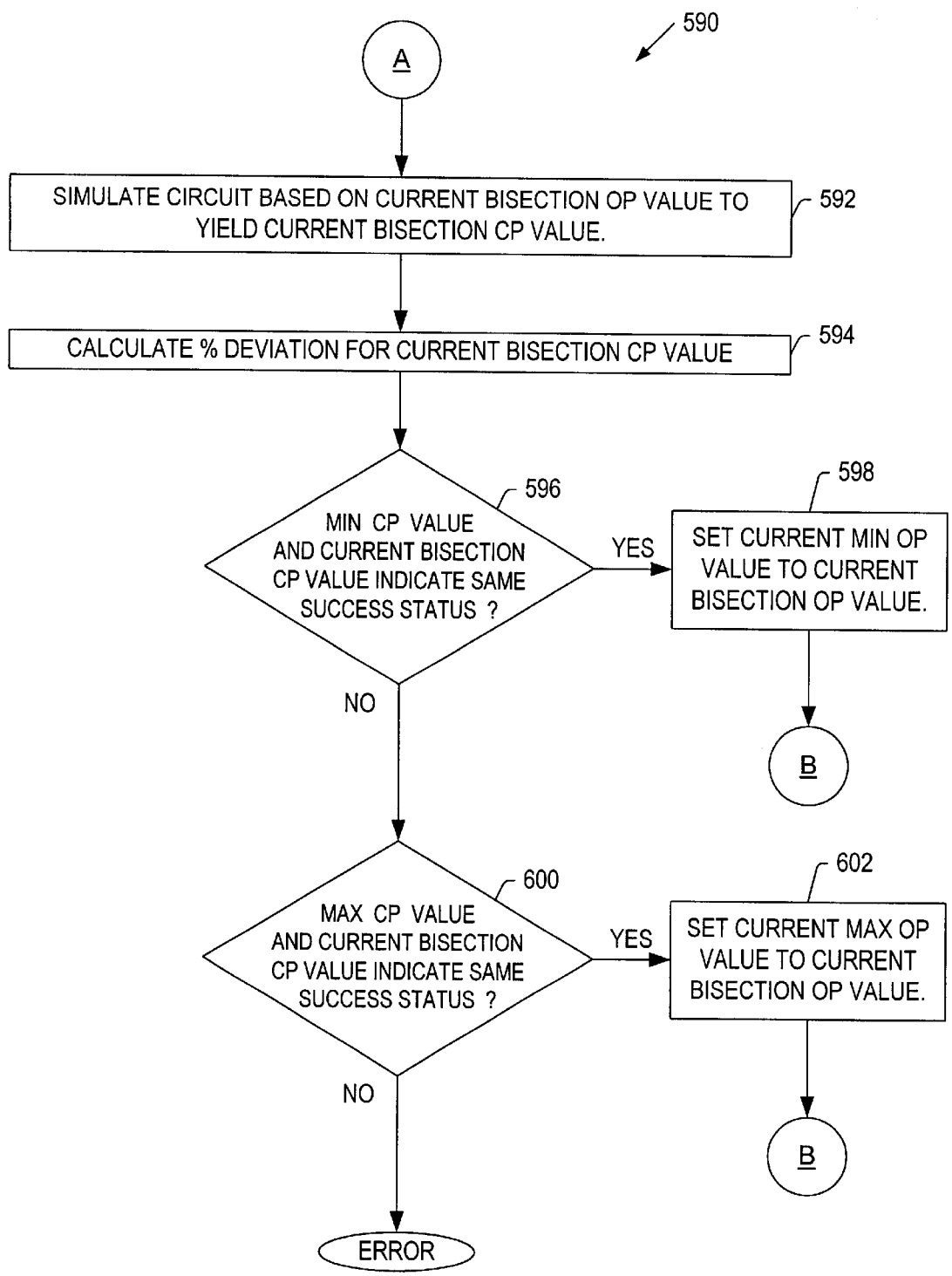

Alternatively, if it is determined at 574 that there is no convergence, the process proceeds to "A" (to FIG. 11B).

FIG. 11B shows a flow diagram illustrating further steps at 590 of the time parameter optimization process 550 (FIG. 11A). The depicted process proceeds from "A" (from FIG. 11A) to step 592 in which the memory characterization system 200 (FIG. 5) simulates the circuit based on the current bisection OP value to yield a current bisection CP value. In step 594, the circuit simulation manager determines the percent deviation for the current bisection CP value in accordance with relationship (2) above.

From step 594, the process proceeds to 596 at which it is determined whether the minimum CP value and current bisection CP value indicate the same success status. If it is determined at 596 that the current minimum CP value and current bisection CP value indicate the same success status, the process proceeds to step 598 in which the circuit simulation manager sets the current minimum OP value to the current bisection OP value, after which the process proceeds back to "B" (to FIG. 11A) to repeat steps 570 through 596 as described above. Alternatively, if it is determined at 596 that the current minimum CP value and current bisection CP value to not indicate the same success status, the process proceeds to 600 at which it is determined whether the current maximum CP value and current bisection CP value indicate the same success status and if so, the process proceeds to step 602 in which the simulation manager sets the current maximum OP value to the current bisection OP value after which the process proceeds to "B" (back to FIG. 11A) to repeat steps 570 through 600 as described above. Alternative, if it is determined at 600 that the current maximum CP value and the current bisection CP value do indicate the same success status, the process determines that there has been an error.

In accordance with one aspect of the time parameter optimization process 550 (FIG. 11 A), a stimulus value is set for an optimization timing parameter for a first simulated cycle of operation of the memory circuit, while the associated criteria parameter is evaluated based on a second simulated cycle of operation of the memory circuit This allows for increased accuracy and flexibility in the optimization process for use in optimizing parameters associated with certain memory circuits. As an example, in a process for optimizing setup time, a stimulus value (data input signal $D_{IN}$) is set for the optimization timing parameter for a write cycle of operation of the memory circuit, while the associated criteria parameter (data output signal $D_{OUT}$) is evaluated based on a read cycle of operation of the memory circuit.

FIGS. 12a through 19 describe operation of the automatic circuit reduction tool 224 (FIG. 5) in accordance with the present invention.

FIG. 12a illustrates the general layout of a circuit design where each odd shape represents a subcircuit and each rectangular box represents a latch. Input pin A connects to subcircuit 703 which is connected to latch 704. Latch 704 connects to subcircuit 705 which is connected to latch 706. Latch 706 connects to subcircuit 707, which is connected to output pin F. In extracting a subcircuit for measuring the timing and characteristics of the signal at pin A, subcircuit 703 and latch 704 would be extracted for pin A. Since for a given clock cycle, the timing and characteristics of the signal at pin A is only affected by the circuitry from pin A to latch 4, no part of subcircuit 705 and downstream circuitry would affect the signal at pin A. Similarly, viewing from output pin F and extracting a subcircuit for the purpose of simulating the timing and characteristics of the signal at output pin F, only subcircuit 707 and latch 706 would be extracted to simulate the signal at output pin F.

To simulate the timing and characteristics of the signal at input pin B, subcircuit 708 and latches 709 and 710 would be found to affect the signal at pin B and these sub-circuitry would be extracted. In simulating and generating the signal at pin B, the timing and characteristics of the signal at input pin C would be fixed. In a likewise manner, the same subcircuit would be extracted to simulate the signal at input pin C since it connects to the same circuitry. Similarly, in simulating input pin C, the timing and characteristics of the signal at input pin B is fixed.

Subcircuit 705 connects to latches 711 and 712 which are connected to subcircuit 713, and subcircuit 713 connects to output pins G and H. Thus, in extracting a subcircuit to represent the timing and characteristics of the signal at 707 output pin G, latches 711 and 712 and subcircuit 713 would be extracted, and the same circuit would be extracted to simulate the signal at output pin H.

As for input pins D and E which are connected to subcircuit 714 and output pin I, since there are no latches, all of subcircuit 714 would be extracted for each of input pins D and E, and output pin I. We now proceed to the methods in identifying and extracting the subcircuits.

Referring to FIG. 12b, the general steps of the preferred method of the present invention are illustrated. Generally speaking, the particular circuit pattern representing the latch is provided in the form of a netlist by the user, and the locations of that particular circuit pattern in the to-be-simulated circuit design are identified 715.

After all of the circuit patterns have been identified in the circuit design, a subcircuit is extracted for each pin of the circuit design from the circuit design. A subcircuit for the simulation of an input pin is determined by tracing the input pin to one or more latches, and the circuitry from the input pin to the found latches are cut out and placed in a netlist file of its own. The same process is applied to each of input pins and each of the output pins 716.

There may be certain input pins and output pins not connected to any latches. In this case, by tracing from an output pin back to the input pins related to this output pin, all of the circuitries in between the particular output pin and input pins are cut out as a subcircuit for the simulation of that output pin 716.

When each subcircuit is cut out from the circuit design, capacitance and resistance loads are added at the cut out points in order to maintain accurate circuit characteristics 717. Additionally, user-specified parameters provided in the netlist of the given circuit design are added to the SPICE netlist for the subcircuits 717. Finally, the subcircuit for each of the input pins and output pins are simulated to generate the timing and characteristics of the signals at each respective pin 718. The output from each of the subcircuits is then made available to the user in a format of the user's choice 718.

FIG. 13 further illustrates the substeps of the step (box 715 of FIG. 12b) in identifying the locations of the particular circuit pattern in a given circuit design. In this process, first, the desired circuit pattern which is provided by the user and typically in a SPICE netlist, is read 720. In the next step 722, a pattern signature for this particular circuit pattern is generated. In generating a pattern signature, each node of the circuit pattern is identified as an internal node or an external node where an internal node is a node not connected to any circuit components outside of the circuit pattern and an external node is a node that can connect to components not part of the circuit pattern. For each of the nodes, either internal or external, the characteristics of 709 that node as defined by the surrounding components are noted and marked in pre-defined fields of a bit pattern. The bit pattern is a simple bit word of a pre-defined length with re-determined fields of various length, each field corresponding to a node characteristic. Some of the node characteristics include:

1. the number of connections to P channel transistors;
2. the number of connections to N channel transistors;
3. the type of logic gate connections (e.g.: Inverter, NOR, NAND);
4. the type of power path, if any (e.g. ground, Vcc); and
5. the number of connections to transistor gate terminals, drain terminals, and source terminals.

For illustration purposes, referring to FIG. 14, a sample circuit pattern for a latch is illustrated. In this pattern, there is a P-channel transistor 730, two N-channel transistors 732 and 734, and three inverters 736, 738, and 740. These components are connected in such a manner giving rise to five external nodes, nodes 741, 742, 744, 748, and 754, and three internal nodes, nodes 746, 750 and 752.

A bit pattern is generated for each of the nodes. For example, node 746 is connected to one P transistor 730, two N transistors 732 and 734, one inverter (combination of 730 and 732), three drain or source terminals, no gate terminal, a path to a voltage source (when transistor 730 is conducting), and a path to ground (when transistor 732 is conducting). For each node characteristic there is a corresponding field in the bit pattern. Similarly, node 750 is connected to three P channel transistors (one from each inverter), four N channel transistors, three inverters, a voltage source, a ground terminal, four gate terminals, and three drain/source terminals.

In addition to the generation of a bit pattern for each internal node, a bit pattern is generated for each external node as well. A field in the bit pattern is provided to indicate the node type. After all of the nodes of the circuit pattern have been analyzed with corresponding signature bit patterns generated, the collective bit patterns of the circuit pattern constitute the signature for the circuit pattern.

FIG. 15 illustrates a bit pattern with various fields. Field 755 may be a single bit indicating whether the node is an external node or internal node. Field 756 may indicate the number of P-channel transistor connections, and field 757 may indicate the number of N-channel connections. The specific format of the bit pattern can be defined as wished and can vary from implementation to implementation.

Referring back to FIG. 13, box 724, after generating the signature for the provided circuit pattern, a signature (a single bit pattern) for each of the nodes in the to-be simulated circuit design are generated in likewise manner. In the next step 726, the most complex internal node bit pattern signature from the signature set of bit patterns is selected and compared with the node signatures of the given circuit design, where the most complex internal node bit pattern signature is the bit pattern having the most significant deviation from the default case (all zeros).

Since each node signature of the circuit design is a bit pattern of the same length having the same pre-defined fields, the comparison step becomes a simple bit pattern to bit pattern comparison operation, which is a very fast operation. However, in order to declare that a circuit pattern has been found in the circuit design, all of the nodes of the circuit pattern have to match the nodes in the circuit design in the correct connective interrelationship.

Thus, once a bit pattern is matched, the next internal node to be matched is determined and the interconnect relationship between the first matched node and the next node is determined. Once this determination is made, a search is made to attempt to match the corresponding internal node bit pattern of the circuit pattern with the corresponding node bit pattern of the circuit design. If successful, this search pattern continues until each internal node of the circuit pattern is matched with a corresponding node in the circuit design before declaring a match. In the case of external node bit patterns, each field of the corresponding bit pattern from the circuit design must be greater than the value in each corresponding field of the external node bit pattern.

Since there may be quite a few occurrences of the circuit pattern in the circuit design, every node of the circuit design is compared in order to find every possible circuit pattern. After this step, the locations of all the circuit patterns of interest would have been found. The process can be repeated for any other circuit pattern of interest before proceeding to the next step.

Having found all of the locations of the circuit patterns in the circuit design, referring to FIG. 16a, we are now interested in determining the relationship between the circuit patterns and the input pins. Reading the netlist of the circuit design and starting from a particular input pin, a forward search of a pre-defined depth (as defined by the number of circuit components) is initiated. If one or more of the circuit patterns are not found within the pre-defined depth, the search from this pin is terminated. If one or more circuit patterns are found, a backward search is initiated from each of the found circuit pattern in order to find all of the circuit components from the found circuit pattern back to the input pin. In this process, several input pins may be found to affect the characteristics of this particular input pin. The found circuit components constitute the subcircuit to be cut-out 762.

In cutting out a subcircuit, there may be several cut-out points connected to other parts of the circuit design. At these cut-out points, devices representing loading effects are added in order to preserve and provide accurate simulation results 764. The value or size of the added loading devices is individually calculated based upon the value(s) of the circuit component(s) at the cut-out point.

In the next step 66, the cut-out circuit is placed in a separate file where user-specified parameters for the particular input pin are added. If there are any other input pins in the same subcircuit, fixed-value parameters are added for these pins. Additionally, control statements for specifying the output format are added as well. At this point, this circuit can be run to simulate and determine the setup time, which is the minimum time required between the initiation of the input signal, the initiation of the clock signal and the generation of a valid latch output signal.

FIG. 16b illustrates a part of a sample circuit design for demonstrating the search path taken to find latches, the circuit to be cut-out, and the connecting of the loading devices.

The search starting from pin J moves forward to inverter 770 and proceeds to AND gate 774 and inverter 772. Since the forward search is depth-limited to so many components, if the signal path following inverter 772 does not lead to a latch within the depth limit, that search path would be terminated. From AND gate 774, the search path continues to AND gate 776 and eventually reaches latch 778. Having now found a latch, a backward search is conducted to find all of the circuitry to be included in the subcircuit to be extracted. In the backward search, each and every input to a connected component is back traced.

For example, from the input terminal of latch 778, the backward search traces every input branch of AND gate 776. Back tracing from the first input branch of AND gate 776, the trace goes to AND gate 774 and both of its input branches are back-traced. From the first input branch of AND gate 774, the signal path is back-traced to inverter 770 and to input pin J. From the second input branch of AND gate 774, the signal path is back-traced to input pin K. Similarly, from the second branch of AND gate 776, the signal path is back-traced to NOR gate 780 where its first input branch connects to input pin L and its second input branch leads to inverter 882 and to input pin M. Likewise, from the third input branch of AND gate 776, the signal path connects to OR gate 784 where its first input branch connects to input pin M and its second input branch connects to input pin N.

In this manner, with respect to input pin J, the circuit to-be-extracted to represent timing and signal characteristics at pin J includes inverter 770, AND gate 774, AND gate 776, latch 778, NOR gate 780, inverter 782, and OR gate 784. There are three cut-out points with respect to this circuit and they are at nodes 792, 794, and 796. An appropriate load device is calculated and added at each of these nodes. These circuit components and the added load devices are placed in a separate netlist file to represent this input pin.

The other input pins are similarly forward searched and backward traced to find relevant circuit components. If the clock signal is of interest, a backward search can be conducted from the clock terminal of the latch. As we shall see, this is of particular interest in the clock-tree application of the present invention.

After searching from each of the input pins, a search from each of the output pins to the specified circuit pattern (e.g. latch) is conducted. Referring to FIG. 17a, the general steps in searching each of the output pins is illustrated. From an output pin, a backward search is conducted in order to find one or more of the circuit patterns. If a circuit pattern is found, another backward search is conducted from the output pin to all possible input pins in order to determine the components of the circuit to be cut-out. The search stops when the related circuit patterns and input pins are found, thereby providing a fairly complete characterization of the output pin. The goal of this type of search is to find one or more circuit patterns, where the user is typically interested in observing the clock delay time which is the time between the initiation of the clock signal at the clock terminal of the latch and the generation of the signal of the output pin).

A third type of search is conducted from the specified input pin to the specified output pin. No circuit pattern is required to be found in this type of search. The search from the specified output pin may continue (if the search is not depth limited by the user) until one or more input pins are encountered. Of course, the specified input pin must be found in order to cut out the desired part of the circuit and to determine the boundary of the cut-out circuit 802. In this type of search, the user is interested in the delay time between the initiation of a signal at the input pin(s) and the generation of a signal at the output pin of interest Once the cut-out circuit is determined, load devices are added at the cut-out points 804. The cut-out circuit is then placed in a file, where user-specified parameters for the output pin and the control statements for the desired output format are added.

At this stage, there is a SPICE file for the output pin, and the pin can be simulated using a variety of parameters to generate corresponding outputs, including the hold time for a given output capacitance.

FIG. 17b illustrates a part of a sample circuit for demonstrating searching from an output pin, determining and cutting out of a subcircuit, and the adding of load devices.

Starting from output pin R, the backward search leads to NOR gate 814, which leads to on one branch AND gate 812 and latch 810, and on another branch inverters 822 and 824, NOR gate 816, and input pins 0 and P. Note that the second input branch of AND gate 812 may be connected to more circuit components upstream and would be included in subcircuit as well. Having found a latch within the prescribed depth, this subcircuit would then be cut-out and placed in a separate netlist. There would be a cut-out point at node 828 which is replaced by a load device.

For output pin S. the backward search would find a different subcircuit then that of output pin R. The NAND gate 818 is included for the case of output pin S, but not for output pin R. For output pin T, no latch would be found from the search. If the user is interested in the timing and characteristics of the signal at output pin T in relation with the related input pin 0, a search would result in a subcircuit that includes input pins 0, P, and Q, NOR gate 816, inverters 822 and 824, and NAND gate 820.

Memory Application of the Present Invention

The above described embodiment of the present invention is not limited to reducing VLSI/ULSI circuit designs of any particular type. A modification of the above described embodiment can be tailored to specific applications, one of which is in memory design application.

Referring to FIG. 18a, a general circuit design of a memory device is illustrated. Given an address 902, the decoder 900 decodes the given address and activates selected ones of the word line 904, bit line 906, and bit_b line 908, in order to read or write to one or more selected memory cells (910–916).

For a given address, only selected ones of the memory cells are active. In simulating a memory circuit design, only those active memory cells need to be simulated. Thus, by extracting and simulating only the active memory cells, the amount of circuit material for simulation, is drastically reduced and thereby significantly improving simulation speed.

FIG. 18b illustrates the steps in selecting and cutting out the active memory cells. First of all 920, the memory cell pattern provided by the user is read and the locations of the memory cell pattern are determined by the method described above 922. For the given memory address, logic simulation of the decoder is performed in order to find the corresponding active word line, bit line and bit b line 924. Once these lines are determined, the memory cells connected to these lines can be determined as well 926. Along with the decoder, these memory cells are cut-out and placed in a separate SPICE file 928. Again loading devices can be added at cut-out points and user-specified input parameters are included. This memory subcircuit can therefore be simulated to generate a number of output values for examination and testing purposes.

Note that there may be a large number of cut-out points where there is one or more loading devices at each cut-out point. Since each loading device may be a pi-shaped RC network and are basically the same loading device, a single representation of a "lumped" loading device may be used where the value of this "lumped" loading device is a multiple of the number of the individual loading devices. In other words, the active bit/bitb lines can be modeled by a number of segments specified by the user where each segment can be represented by a pi-shaped RC network and a MOSFET with a multiplier instead of multiple p1-shaped RC networks and MOSFETs.

Yet another simulation scheme is possible under the present invention. Since the memory cells are structured in a regular pattern, the configurations of memory array can be constructed just before the designated read/write access between cells. The loadings and cell positions, which are time-variant, can be modeled using time-dependent resistance and capacitance, which are controlled by input address and control signals. In this manner, we only need a limited number (maybe 4) of memory cells to model an entire array, and the amount of memory required is significantly reduced in simulation.

Clock Tree Generation Application

The present invention can also be applied in the area of clock signal analysis. For a given circuit, there may be a number of components such as latches that are connected to the clock signal. Since the connection of the clock signal to these components may pass through a number of other circuit components, it is important to observe and ensure that the clock signal to these connected components are synchronized within an acceptable tolerance.

Referring to FIG. 19, the first step in this process is to read in one or more circuit patterns of interest, typically a latch of some type 950. The location of the circuit pattern in the given to-be-simulated circuit design is then determined 952. Since the circuit pattern here would typically have a clock terminal, a backward search from each of the clock terminals of the found circuit pattern back to the clock pin of the circuit design is conducted. After the search, all of the circuit components affecting the clock signal are then determined and copied from the circuit design and placed in a separate file where loading devices again can be added at the cut-out points 956. To simulate the cut-out circuit, user-specified input parameters and output control statements are added to the file.

ABSTRACTION OF A CIRCUIT DESIGN

Given the method of finding a given circuit pattern in a circuit design, the present invention can be applied to abstract a circuit design from a representation at the transistor level to a representation at the block, cell, or gate level. For example, given the circuit pattern for a latch in terms of gates and a circuit design in terms of transistors (which may include some representation at the gate level), the circuit pattern representation at the gate level can be translated to the transistor level and a signature generated for the circuit pattern at the transistor level. Through the circuit pattern search method described above, the locations of the circuit patterns within the circuit design can be found. Once a circuit pattern is matched within the circuit design, the matched portion of the circuit design can be substituted by the gate level representation of the circuit pattern. In this manner, the entire circuit design can be abstracted from the transistor level to the gate level if the corresponding circuit patterns are found.

Although the present invention has been particularly shown and described above with reference to a specific embodiment, it is anticipated that alterations and modifications thereof will no doubt become apparent to those skilled in the art. It is therefore intended that the following claims be interpreted as covering all such alterations and modifications as fall within the true spirit and scope of the invention.

What is claimed is:

1. An automatic memory characterization process comprising the steps of:
   (a) receiving a memory circuit netlist extracted from layout data defining an instance a memory circuit of a memory compiler design;
   (b) performing an automatic circuit reduction process on said circuit netlist to generate a critical path netlist;
   (c) generating a specification file based on a data sheet associated with at least one timing parameter to be characterized for said circuit, said specification file including at least one input signal parameter defining an associated input signal to be provided to a selected input node of said circuit, and at least one output loading parameter defining an associated output load to be applied to a selected output node of said circuit;
   (d) generating an updated stimulus file based on said input signal parameters;
   (e) generating an updated critical path netlist based on said critical path netlist and said at least one output loading parameter; and
   (f) performing at least one circuit simulation process based on said updated critical path netlist and said updated stimulus file to yield an associated value for said timing parameter.

2. An automatic memory characterization process as recited in claim 1 wherein said step (c) of generating a specification file comprises a step of using a graphical user interface to generate said specification file based on a data sheet.

3. An automatic memory characterization process as recited in claim 1 wherein said timing parameter is a setup time parameter, and wherein said at least one input signal parameter include clock signal parameters having a clock cycle parameter, a clock signal rise time parameter, and a clock signal fall time parameter.

4. An automatic memory characterization process as recited in claim 1 wherein said step (b) of performing an automatic circuit reduction process on said circuit netlist further comprises architecture recognition steps of:
   defining a circuit pattern to be identified in said circuit;
   identifying at least one portion of said circuit that includes said circuit pattern;
   tracing from an input/output/clock pin of said circuit to at least one of the identified circuit pattern locations to identify an interconnecting sub-circuit; and
   extracting and storing a description of said interconnecting sub-circuit.

5. An automatic memory characterization process as recited in claim 1 further comprising steps for automatically determining an optimal value for an optimization timing parameter associated with said circuit by using a bisection model to determine optimization parameter values and by repeating said step (f) of performing circuit simulations for each of said optimization parameter values.

6. An automatic memory characterization process as recited in claim 5 wherein said steps for automatically determining an optimal value for an optimization timing parameter further comprise:
   setting a stimulus value for said optimization timing parameter for a first simulated cycle of operation of said memory circuit; and
   evaluating a criteria parameter associated with said optimization timing parameter based on a second simulated cycle of operation of said memory circuit.

7. An automatic memory characterization process as recited in claim 6 wherein said optimization timing parameter is a setup time parameter and wherein said first cycle is a write cycle, and said second cycle is a read cycle.

8. An automatic memory characterization process as recited in claim 1 wherein said process provides for determining an optimal value of said at least one timing parameter for said memory circuit, and wherein:
   said step (d) of generating a stimulus file includes,
      generating a first updated stimulus file associated with a minimum value of said timing parameter,
      generating a second updated stimulus file associated with a maximum value of said timing parameter; and
   said step (f) of performing at least one circuit simulation process includes optimization steps of,
      simulating said circuit based on said first updated stimulus file to generate a first criteria parameter value, and
      simulating said circuit based on said second updated stimulus file to generate a second criteria parameter value.

9. An automatic memory characterization process as recited in claim 8 wherein said process further comprises the steps of:
   determining a first percent deviation value for said first criteria parameter value, said first percent deviation value indicating a success status associated with said first criteria parameter value,
   determining a second percent deviation value for said second criteria parameter value, said second percent deviation value indicating a success status associated with said second criteria parameter value, and
   determining whether said first and second percent deviation values indicate a same success status.

10. An automatic memory characterization process as recited in claim 1 further comprising the step of generating a timing/power model including said yielded values for said timing parameters.

11. An automatic memory characterization process as recited in claim 10 wherein:
    said step (a) of receiving a memory circuit netlist further includes the steps of,
       receiving a request for a critical memory instance characterization from a user via a network, said request specifying a memory instance including layout data, and
       performing layout extraction on said memory instance to generate said netlist; and said process further comprises the step of providing characterization results including said timing/power model back to said user via said network.

12. An automatic memory characterization system for determining timing characteristics associated with each of a plurality of circuit instances of a memory compiler circuit design, the system comprising:

an automatic circuit reduction tool for receiving a circuit netlist extracted from layout data defining a circuit instance of the memory compiler, and for performing an automatic circuit reduction process on said circuit netlist to generate a critical path netlist;

a memory storage unit for storing a timing parameter database including a script file having memory characterization instructions, and at least one specification file associated with one of the timing characteristics to be characterized for said circuit instance, said specification file having a plurality of input signal parameters defining a plurality of input signals to be applied to selected input nodes of said circuit instance, and a plurality of output loading parameters defining a plurality of output loads to be applied to selected output nodes of said circuit instance;

a stimulus generator responsive to said input signal parameters and operative to generate a stimulus file; and a circuit simulation manager operative to access said timing parameter database, and to execute at least a portion of said memory characterization instructions, and to generate an updated critical path netlist based on said output loading parameters, said updated critical path netlist and said stimulus file being adapted for use in simulation of said circuit instance.

13. An automatic memory characterization system as recited in claim 12 wherein said circuit simulation manager is operative to automatically determine an optimal value for an optimization timing parameter by using a bisection model to determine optimization parameter values.

14. An automatic memory characterization system as recited in claim 13 further comprising:

a circuit simulator responsive to said updated critical path netlist and said updated stimulus file, and operative to yield an associated value for said timing parameter.

15. An automatic memory characterization system as recited in claim 14 wherein said circuit simulation manager is further operative to determine an optimal value of said timing parameter for said memory circuit by performing the steps of:

generating a first updated stimulus file associated with a minimum value of said timing parameter, and generating a second updated stimulus file associated with a maximum value of said timing parameter;

performing at least one circuit simulation process including optimization steps of simulating said circuit based on said first updated stimulus file to generate a first criteria parameter value, and simulating said circuit based on said second updated stimulus file to generate a second criteria parameter value.

16. An automatic memory characterization system as recited in claim 15 circuit simulation manager is further operative to perform the steps of:

determining a first percent deviation value for said first criteria parameter value, said first percent deviation value indicating a success status associated with said first criteria parameter value, determining a second percent deviation value for said second criteria parameter value, said second percent deviation value indicating a success status associated with said second criteria parameter value, and determining whether said first and second percent deviation values indicate a same success status.

17. An automatic memory characterization system as recited in claim 16 wherein said optimization timing parameter is a setup time parameter and wherein said first cycle is a write cycle, and said second cycle is a read cycle.

18. An automatic memory characterization system as recited in claim 15 circuit simulation manager is further operative to perform the steps of:

setting a stimulus value for said optimization timing parameter for a first simulated cycle of operation of said memory circuit; and evaluating a criteria parameter associated with said optimization timing parameter based on a second simulated cycle of operation of said memory circuit.

\* \* \* \* \*